(12) United States Patent
Li et al.

(10) Patent No.: US 12,471,347 B2
(45) Date of Patent: Nov. 11, 2025

(54) VERTICAL POWER SEMICONDUCTOR DEVICE AND MANUFACTURING METHOD THEREOF

(71) Applicant: Diodes Incorporated, Plano, TX (US)

(72) Inventors: Jie Li, New Taipei (TW); Ming-Wei Tsai, New Taipei (TW); Chiao-Shun Chuang, New Taipei (TW); Ching-Wen Wang, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/969,220

(22) Filed: Dec. 4, 2024

(65) Prior Publication Data

US 2025/0203998 A1    Jun. 19, 2025

(30) Foreign Application Priority Data

Dec. 13, 2023  (CN) .......................... 202311713529.3

(51) Int. Cl.
*H10D 64/23* (2025.01)
*H10D 30/01* (2025.01)
(Continued)

(52) U.S. Cl.
CPC ....... *H10D 64/252* (2025.01); *H10D 30/0291* (2025.01); *H10D 30/66* (2025.01);
(Continued)

(58) Field of Classification Search
CPC .. H10D 64/252; H10D 64/01; H10D 30/0291; H10D 62/154; H10D 30/66;
(Continued)

(56) References Cited

U.S. PATENT DOCUMENTS 9,246,016 B1  1/2016 Yen et al.
9,887,270 B2  2/2018 Iwaya et al.
(Continued)

FOREIGN PATENT DOCUMENTS

TW    201301366 A    1/2013
TW    201306255 A    2/2013
TW    201327727 A    7/2013

OTHER PUBLICATIONS

Office Action and Search Report for Taiwan Patent Application No. 113113065, mailed Apr. 24, 2025, 22 pages.

*Primary Examiner* — Jacob Y Choi
*Assistant Examiner* — Neil R Prasad
(74) *Attorney, Agent, or Firm* — AP3 Law Firm PLLC

(57) ABSTRACT

A semiconductor device includes a substrate comprising a first surface and a second surface positioned on an opposite side of the substrate. A first gate structure is located above the first surface of the substrate and a second gate structure is located above the first surface of the substrate, adjacent to the first gate structure. A first dielectric layer covers the first gate structure, the second gate structure, and the first surface of the substrate. The first dielectric layer has a first opening between the first gate structure and the second gate structure. A current spreading layer is located at a bottom of the first opening. The current spreading layer has a first width approximately equal to a width of the bottom of the first opening. A conductive plug is located between the first gate structure and the second gate structure and in contact with the current spreading layer.

18 Claims, 25 Drawing Sheets

(51) Int. Cl.
*H10D 30/66* (2025.01)
*H10D 62/00* (2025.01)
*H10D 62/10* (2025.01)
*H10D 62/13* (2025.01)
*H10D 62/832* (2025.01)
*H10D 64/01* (2025.01)

(52) U.S. Cl.
CPC ........... *H10D 62/01* (2025.01); *H10D 62/127* (2025.01); *H10D 62/153* (2025.01); *H10D 62/154* (2025.01); *H10D 62/8325* (2025.01); *H10D 64/01* (2025.01)

(58) Field of Classification Search
CPC ............... H10D 62/153; H10D 62/127; H10D 62/8325; H10D 62/01
See application file for complete search history.

(56) References Cited

U.S. PATENT DOCUMENTS

| | | |
|---|---|---|
| 2017/0178989 A1 | 6/2017 | Matocha et al. |
| 2022/0246744 A1* | 8/2022 | Siemieniec .......... H10D 12/031 |
| 2022/0285483 A1* | 9/2022 | Tsuji ................... H01L 21/7602 |
| 2022/0310838 A1* | 9/2022 | Weber .................. H10D 12/481 |
| 2023/0238427 A1 | 7/2023 | Weber |
| 2023/0307529 A1* | 9/2023 | Kim ..................... H10D 12/031 |
| 2025/0113531 A1* | 4/2025 | Potera ................. H10D 62/124 |

* cited by examiner

VERTICAL POWER SEMICONDUCTOR DEVICE AND MANUFACTURING METHOD THEREOF

CROSS-REFERENCE TO RELATED APPLICATIONS

This patent application claims priority to Chinese Patent Application No. CN 202311713529.3, filed on Dec. 13, 2023, and entitled "Vertical Power Semiconductor Device and Manufacturing Method Thereof," which is hereby incorporated by reference herein as if reproduced in its entirety.

TECHNICAL FIELD

The present disclosure relates generally to the field of semiconductors, and in particular embodiments, to a vertical power semiconductor device and a manufacturing method thereof. More specifically, it pertains to a vertical power semiconductor device with a current spreading layer and a manufacturing method thereof.

BACKGROUND

The semiconductor integrated circuit industry has experienced rapid growth over the past few decades. Technological advancements in semiconductor materials and design have led to increasingly compact and complex circuits. As processing and manufacturing technologies have also advanced, the development of new materials and designs has become possible. As semiconductor development progresses and the minimum manufacturable component size decreases, the density of interconnect devices per unit area increases, limiting the allowable contact area between conductive elements along the current conduction path. This results in higher device resistance or reduced product reliability.

Therefore, there is a need for innovative solutions that can effectively reduce device resistance, improve current spreading, and enhance the overall reliability of semiconductor devices, especially as feature sizes continue to shrink with advancing technology.

SUMMARY

Technical advantages are generally achieved, by embodiments of this disclosure which describe a vertical power semiconductor device and manufacturing methods thereof.

Embodiments of the present disclosure relate to a semiconductor device. The semiconductor device includes: a substrate comprising a first surface and a second surface opposite the first surface; a first gate structure and a second gate structure located over the first surface of the substrate; a first dielectric layer covering the first gate structure, the second gate structure, and portions of the first surface of the substrate; a current spreading layer located between the first gate structure and the second gate structure, wherein at least a portion of the current spreading layer is located in the substrate; and a conductive plug located on the current spreading layer, wherein the current spreading layer has a first width larger than a second width of a bottom of the conductive plug.

Embodiments of the present disclosure relate to a manufacturing method of a vertical power semiconductor device. The manufacturing method of the vertical power semiconductor device includes: forming a first gate structure and a second gate structure over a substrate; forming a first dielectric layer covering the first gate structure, the second gate structure, and portions of a top surface of the substrate; performing a first patterning process on the first dielectric layer to form a first opening between the first gate structure and the second gate structure, exposing a portion of the substrate; forming a metal layer on a bottom of the first opening, covering the exposed portion of the substrate; performing a first annealing process on the metal layer to form a metal silicide layer; performing a second annealing process on the metal silicide layer to form a current spreading layer, wherein a temperature of the second annealing process is higher than a temperature of the first annealing process; and forming a conductive plug on the current spreading layer, wherein a first width of a bottom of the conductive plug is less than a second width of the current spreading layer.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings. It is important to acknowledge that the proportional representation of various structures may not be strictly adhered to. In practice, for the sake of elucidation, the dimensions of these structures may be deliberately exaggerated or minimized to enhance clarity in explanation.

Figure 1:
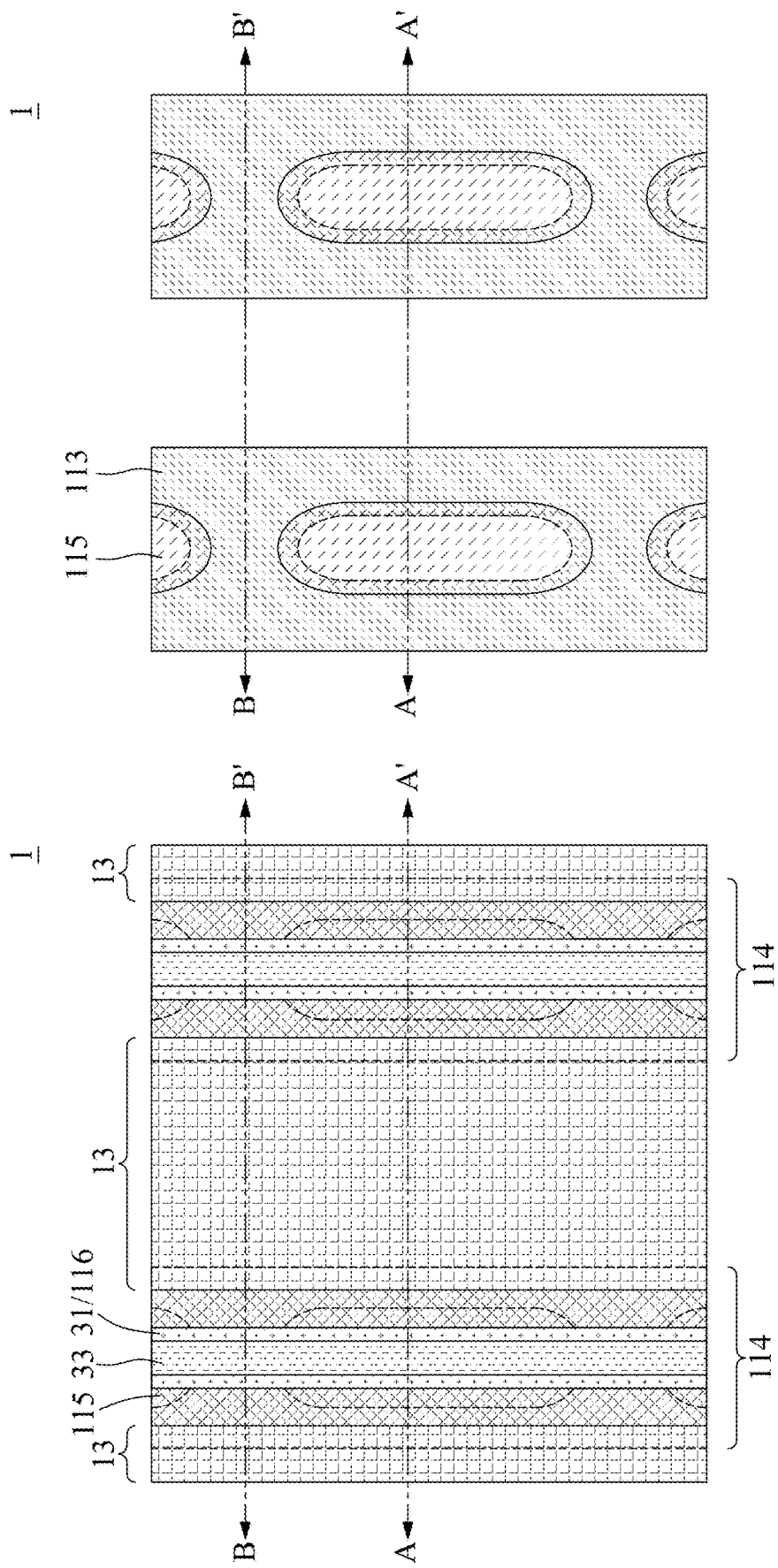
FIG. 1A is a top view of an example vertical power semiconductor structure according to some embodiments of the present disclosure.
FIG. 1B is a top perspective view of doped regions of the vertical power semiconductor structure according to some embodiments of the present disclosure.

The same or similar components are marked with the same reference numerals and symbols in the drawings and detailed description. The figures are drawn to clearly illustrate the relevant aspects of the embodiments and are not necessarily drawn to scale. Embodiments of the present disclosure will be readily understood from the following detailed description in conjunction with the accompanying drawings.

DETAILED DESCRIPTION OF ILLUSTRATIVE EMBODIMENTS

The following disclosure provides numerous different embodiments or examples for implementing the various features of the provided subject matter. Specific instances of components and configurations are described below. Of course, these are merely examples and are not intended to limit the scope of the present disclosure. In this disclosure, references to the formation of a first feature above or on top of a second feature may include embodiments where the first and second features are formed in direct contact, as well as embodiments where additional features are formed between the first and second features, allowing for cases where the first and second features do not directly contact each other. Additionally, the disclosure may repeat reference numerals and/or letters across various instances. This repetition is for simplicity and clarity and does not indicate any relationship between the various embodiments and/or configurations being discussed.

Further, it should be understood that various changes, substitutions and alterations can be made herein without departing from the spirit and scope of this disclosure as defined by the appended claims. One or more features from one or more of the following described embodiments may be combined to create alternative embodiments not explicitly described, and features suitable for such combinations are understood within the scope of this disclosure. It is therefore intended that the appended claims encompass any such modifications or embodiments.

The embodiments of the present disclosure are discussed in detail below. However, it should be understood that this disclosure offers many applicable concepts that can be embodied in a wide variety of specific environments. The specific embodiments discussed are merely illustrative and do not limit the scope of the present disclosure.

Figure 2:
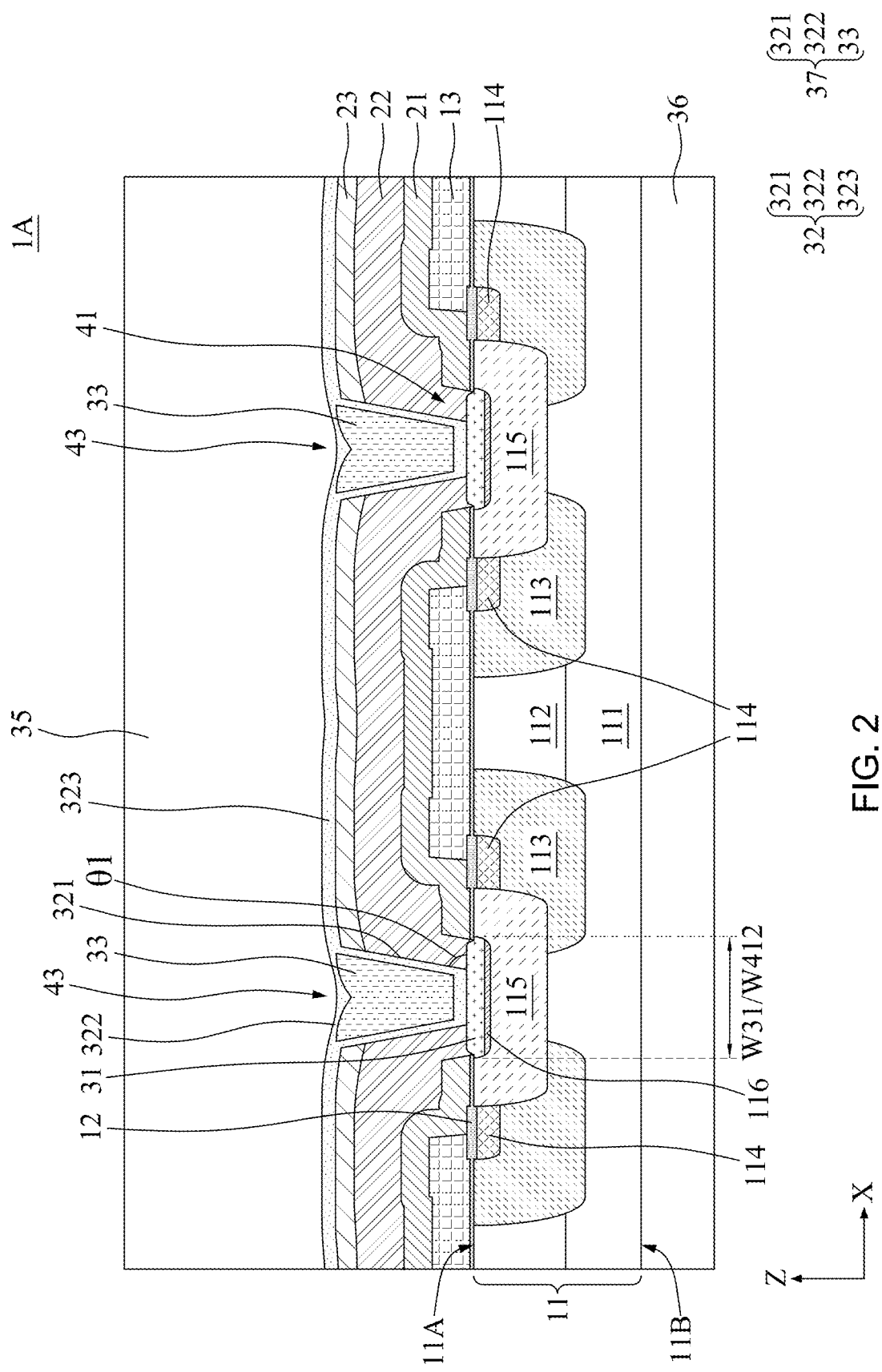
FIG. 2 is a cross-sectional view along line A-A' of the semiconductor structure in FIG. 1A and FIG. 1B, according to some embodiments of the present disclosure.
Figure 3:
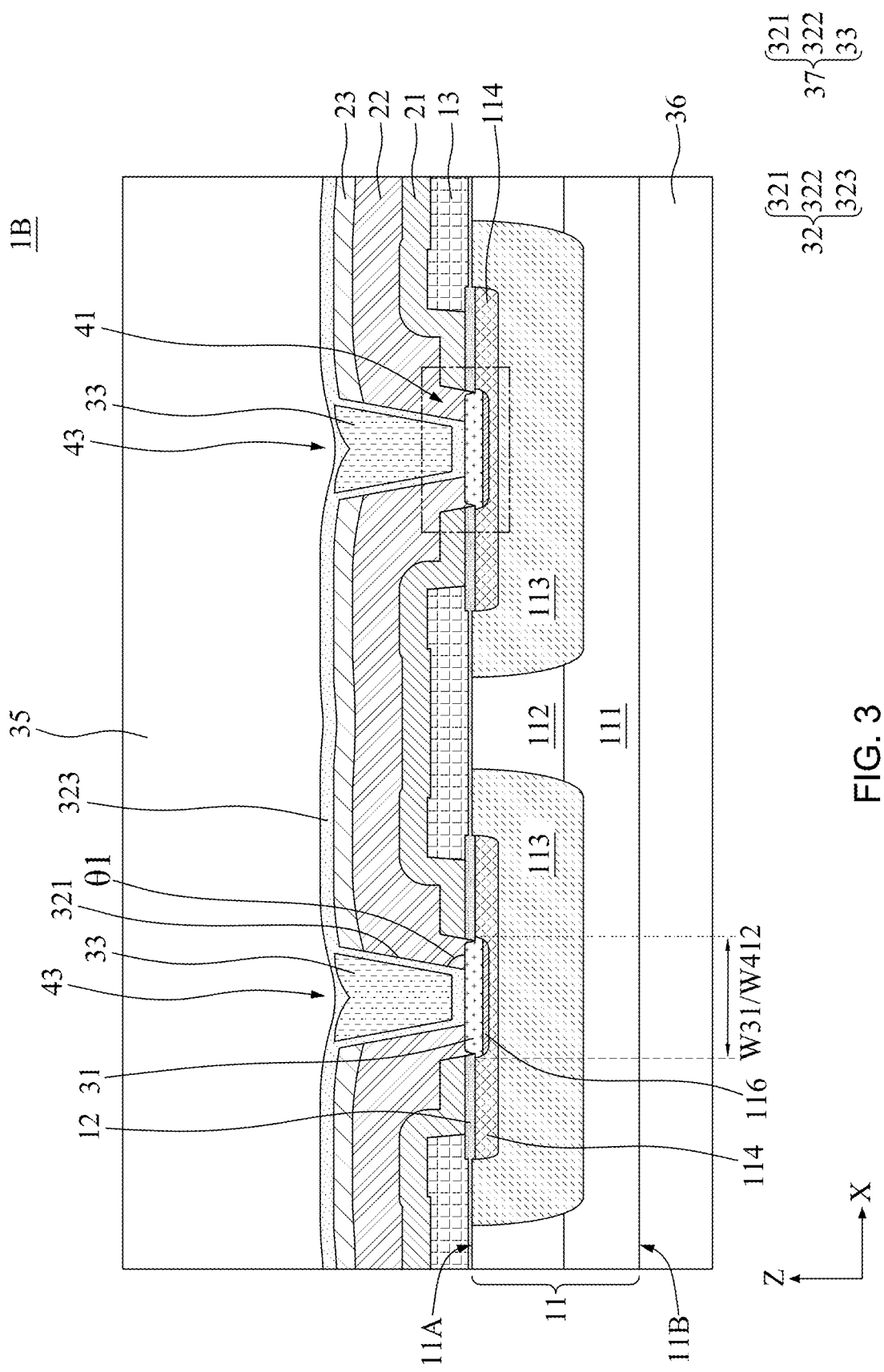
FIG. 3 is a cross-sectional view along line B-B' of the vertical power semiconductor structure in FIG. 1A and FIG. 1B, according to some embodiments of the present disclosure.

FIGS. 1A, 1B, 2, and 3 are schematic diagrams of an example vertical power semiconductor structure 1 in accordance with various embodiments of the present disclosure. FIG. 1A shows a partial top view of the vertical power semiconductor structure 1. FIG. 1B shows a top perspective view of doped regions 113 and 115 of the vertical power semiconductor structure 1. FIG. 2 shows a cross-sectional view along the A-A' line of the vertical power semiconductor structure 1 (labeled as 1A) in FIGS. 1A and 1B. FIG. 3 shows a cross-sectional view along the B-B' line of the vertical power semiconductor structure 1 (labeled as 1B) in FIGS. 1A and 1B. At least some of these drawings have been simplified to better illustrate aspects of this disclosure.

Referring to FIGS. 1A, 1B, 2, and 3, the vertical power semiconductor structure 1 may be implemented in different types or manufactured by various techniques. For example, the vertical power semiconductor structure 1 may be configured as a power metal-oxide-semiconductor field-effect transistor (MOSFET), a double-diffused MOSFET (DMOSFET), an insulated-gate bipolar transistor (IGBT), or a junction gate field-effect transistor (JFET). Specifically, the vertical power semiconductor device has a vertical current conduction path. For instance, current in the vertical power semiconductor structure 1 can flow in a direction orthogonal to the active surface of the vertical power semiconductor structure 1. The current can flow vertically through the vertical power semiconductor structure 1. It should be noted that the vertical power semiconductor structure 1 in FIGS. 1A and 1B comprises a substrate 11 made of silicon carbide material and a gate structure 13 formed on the substrate 11, shown for illustrative purposes and not as a limitation of this application.

In some embodiments, the vertical power semiconductor structure 1 comprises a substrate 11, gate structures 13 above the substrate 11, at least one dielectric layer (e.g., dielectric layers 21, 22, 23) covering the gate structures 13, a current spreading layer 31 within an opening in the dielectric layer 21 between the gate structures 13, and a conductive plug 37 on the current spreading layer 31. The width of the conductive plug 37 is smaller than the width of the current spreading layer 31.

The substrate 11 has a surface 11A and an opposite surface 11B. In some embodiments, surfaces 11A and 11B can be horizontal planes. For convenience, the direction orthogonal to surfaces 11A and 11B is defined as the vertical direction, while the directions orthogonal to the vertical direction (e.g., the Z direction) are defined as horizontal directions (e.g., the X and Y directions). The surface 11A of the substrate 11 is defined as the top surface of the substrate 11, and surface 11B as the bottom surface of the substrate 11. In some embodiments, surface 11A may serve as the active surface of the substrate 11.

In some embodiments, the substrate 11 may comprise, for example, N-type or P-type monocrystalline silicon, epitaxial silicon, silicon carbide (SiC), germanium (Ge), silicon-germanium (SiGe), gallium nitride (GaN), gallium arsenide (GaAs), gallium arsenide phosphide (GaAsP), or other semiconductor materials. The substrate 11 comprises p-type doped regions and n-type doped regions, which can be configured for an n-type transistor and can also be configured for a p-type transistor. The n-type doped region is doped with n-type dopants, such as phosphorus, arsenic, other n-type dopant ions, or a combination thereof. The p-type doped region is doped with p-type dopant ions, such as boron, indium, other p-type dopant ions, or a combination thereof. The n-type or p-type doped regions can be formed using ion implantation, diffusion, and/or other suitable doping processes. In some embodiments, the substrate 11 may comprise a lightly doped region 111 of the first conductivity type adjacent to surface 11B. For convenience, the following discussion will use N-type as an example of the first conductivity type. However, this disclosure is not limited to this configuration; the substrate 11 can be adapted to N-type (first conductivity type) or P-type (second conductivity type) based on the conductivity type of the vertical power semiconductor structure 1.

In addition to the lightly doped region 111, the vertical power semiconductor structure 1 may also comprise multiple doped regions 112, 113, 114, 115, and 116.

The doped region 112 has the same conductivity type as the lightly doped region 111, such as N-type. In some embodiments, the doped region 112 may have a higher first-type dopant concentration than the lightly doped region 111. The doped regions 111 and 112 together form the substrate doped region, and the gradient in concentration between doped regions 111 and 112 helps reduce forward voltage (VF) and resistance, though this disclosure is not limited to this configuration. In some embodiments, the doped region 112 is located on one side of the lightly doped region 111, adjacent to surface 11A. In some embodiments, the doped region 112 is positioned above the lightly doped region 111 in the Z direction. In some embodiments, the doped region 112 is adjacent to surface 11A of the substrate 11. In some other embodiments, the doped regions of the substrate 11 do not have a concentration gradient; in other words, the doped regions 111 and 112 shown in the figures may be merged into a single first conductivity type doped region with uniform concentration.

The doped region 113, serving as the body doped region of the vertical power semiconductor structure 1 (hereafter referred as body doped region 113), is located in the substrate 11 between gate structures 13. The body doped region 113 extends from surface 11A toward surface 11B. In some embodiments, the body doped region 113 is adjacent to surface 11A. The depth of the body doped region 113 from surface 11A along the Z direction may be greater than or equal to the depth of the doped region 112. In some embodiments, as shown in FIGS. 2 and 3, the depth of the body doped region 113 from surface 11A in the Z direction is greater than the depth of the doped region 112, ensuring that the depth of the body doped region 113 is not less than that of the doped region 112. The body doped region 113 is at least located between adjacent gate structures 13. In some embodiments, parts of the gate structure 13 adjacent to the body doped region 113 may partially cover the body doped region 113.

The doped region 114 serves as the source of the vertical power semiconductor structure 1 (hereinafter referred to as source doped region 114), located within the body doped region 113. In some embodiments, the source doped region 114 is adjacent to surface 11A of the substrate 11. The depth of the source doped region 114 from surface 11A toward surface 11B is less than the depth of the body doped region 113. The source doped region 114 has a different conductivity type from the body doped region 113, such as N-type. In some embodiments, the doping concentration of the first-type dopant ions in the source doped region 114 is greater than the doping concentration of the second-type dopant ions in the body doped region 113. In some embodiments, as shown in FIG. 1A, the vertical power semiconductor structure 1 may have multiple source doped regions 114 extending along the Y direction, and these source doped regions 114 are parallel to each other.

The vertical power semiconductor structure 1 may also comprise a heavily doped region 115 located in the substrate 11 between the gate structures 13. In some embodiments, the heavily doped region 115 is separated from the gate structures 13 along the Z direction, as shown in FIGS. 2 and 3. In other words, the heavily doped region 115 is not covered by the gate structures 13, as shown in FIG. 1A. In some embodiments, part of the heavily doped region 115 is adjacent to part of surface 11A of the substrate 11. In some embodiments, the depth of the heavily doped region 115 from surface 11A along the Z direction toward surface 11B is less than the depth of the body doped region 113 and greater than the depth of the source doped region 114. The heavily doped region 115 has the same conductivity type as the body doped region 113, such as P-type. The doping concentration of the second-type dopant ions in the heavily doped region 115 may be greater than the doping concentration of the second-type dopant ions in the body doped region 113.

The bottom of the heavily doped region 115 is in contact with both the body doped region 113 of the second conductivity type and the lightly doped region 111 of the first conductivity type. Additionally, the heavily doped region 115 contacts the source doped region 114, electrically connecting the body doped region 113 and the source doped region 114. This prevents a voltage difference between the emitter and base of a parasitic bipolar junction transistor (BJT), thereby preventing activation of the parasitic BJT. Additionally, the heavily doped region 115 functions similarly to the body doped region 113, ensuring it does not impair the performance of the vertical power semiconductor structure 1 and further prevents the activation of parasitic elements. In some embodiments, the heavily doped region 115 may connect adjacent and separated body doped regions 113, as shown in the cross-sectional view in FIG. 2.

The number, pattern, coverage, depth, and other characteristics of the heavily doped region 115 can be adjusted according to different embodiments. In some embodiments, the coverage area of the heavily doped region 115 may fall within the source doped region 114, as shown in the top view in FIG. 1A. The vertical power semiconductor structure 1 may comprise multiple heavily doped regions 115. In some embodiments, each source doped region 114 may contain multiple heavily doped regions 115 arranged along the Y direction and separated from each other. In some embodiments, each heavily doped region 115 may have a configuration extending along the Y direction, though this disclosure is not limited to this configuration. In some embodiments, as shown in FIGS. 1A, 1B, and 2, the width of the heavily doped region 115 in the X direction may be less than the width of the source doped region 114. In some embodiments, as shown in FIGS. 1A, 1B, and 2, the width of the heavily doped region 115 in the X direction may be greater than the width of the current spreading layer 31.

The vertical power semiconductor structure 1 may comprise multiple adjacent and separated gate structures 13. The gate structures 13 are arranged above surface 11A of the substrate 11. In some embodiments, The gate structures 13 are arranged on surface 11A of the substrate 11. In some embodiments, as shown in the top view of FIG. 1A, the multiple gate structures 13 extend along the Y direction and are parallel to each other. The gate structures 13 may comprise, for example, a gate electrode layer, a gate dielectric layer between the gate electrode layer and surface 11A of the substrate 11, spacers, etc. The specific structure of gate structures 13 may vary based on the manufacturing process and method, and therefore a detailed description of the gate structures 13 is not provided here. In some embodiments, parts of the gate structures 13 adjacent to the body doped region 113 may cover portions of the body doped region 113 along the Z direction. In some embodiments, the source doped region 114 extends between adjacent gate structures 13, with opposite sides of the source doped region 114 overlapping partially beneath two adjacent gate structures 13. In some embodiments, parts of the gate structures 13 adjacent to the source doped region 114 cover portions of the source doped region 114 along the Z direction. In some embodiments, the overlap of gate structures 13 with the body doped region 113 in the X direction is greater than the overlap of gate structures 13 with the source doped region 114.

The vertical power semiconductor structure 1 may further comprise a heavily doped region 116, located in the substrate 11 between the gate structures 13 and covered by the current spreading layer 31. In some embodiments, the heavily doped region 116 is adjacent to the bottom of the current spreading layer 31. In some embodiments, the first heavily doped region 116 is separated from the source doping region 114 by at least a portion of the second heavily doped region 115. In some embodiments, the depth of the heavily doped region 116 from surface 11A along the Z direction toward surface 11B is less than the depth of the source doped region 114. The heavily doped region 116 has the same conductivity type as the source doped region 114, such as N-type. In some embodiments, the doping concentration of the first conductivity type ions in the heavily doped region 116 may be greater than the doping concentration of the first conductivity type ions of the source doped region 114. In some embodiments, the heavily doped region 116 may align with the current spreading layer 31. In some embodiments, the width of the heavily doped region 116 may be smaller than the width of the current spreading layer 31.

As shown in FIGS. 1A and 1B, the vertical power semiconductor structure 1 may comprise multiple heavily doped regions 116 extending along the Y direction, and these regions are parallel to each other. The number of heavily doped regions 116 corresponds to the number of source doped regions 114. In some embodiments, the heavily doped region 116 is within the source doped region 114, as shown in the top view of FIG. 1A. In some embodiments, as shown in FIGS. 1A and 3, the width of the heavily doped region 116 in the X direction may be equal to or greater than the width of the current spreading layer 31 but smaller than the width of the source doped region 114. In some embodiments, as shown in FIGS. 1A and 2, the width of the heavily doped region 116 in the X direction may be smaller than the width of the heavily doped region 115.

The depth of the heavily doped region 116 can be adjusted according to different embodiments and manufacturing processes. In some embodiments, a portion of the substrate 11 covered by the heavily doped region 116 may be converted into part of the current spreading layer 31 through a silicidation process, so that the heavily doped region 116 beneath the current spreading layer 31 is not visible in the final product. In some embodiments, the current spreading layer 31 may contact the source doped region 114.

The vertical power semiconductor structure 1 may further comprise a dielectric layer 12 located on surface 11A of the substrate 11. The dielectric layer 12 covers surface 11A of the substrate 11 and extends along surface 11A. Depending on the different manufacturing methods, the thickness of the dielectric layer 12 on surface 11A may be uniform or non-uniform. In some embodiments, as shown in cross-sectional structures 1A and 1B in FIGS. 2 and 3, the dielectric layer 12 that contacts the source doped region 114 may have a greater thickness. In some embodiments, the dielectric layer 12 may be formed by an oxidation process, and different parts of the substrate 11 with varying doping concentrations exhibit different oxidation rates, resulting in a non-uniform thickness of the dielectric layer 12 on surface 11A. For the current spreading layer 31 to contact the substrate 11, the dielectric layer 12 has an opening between adjacent gate structures 13.

The vertical power semiconductor structure 1 may further comprise a dielectric layer 21 that covers the gate structures 13 and part of surface 11A of the substrate 11. For the current spreading layer 31 to electrically connect to the source doped region 114, the dielectric layer 21 has an opening between adjacent gate structures 13. In some embodiments, the dielectric layer 12 further extends between surface 11A of the substrate 11 and the dielectric layer 21. In some embodiments, the opening in the dielectric layer 21 aligns with the opening in the dielectric layer 12 (hereinafter collectively referred to as opening 41 for simplicity). In some embodiments, the sidewalls of the dielectric layer 21 align with the sidewalls of the dielectric layer 12. In some embodiments, the sidewalls of the dielectric layer 21 and the sidewalls of the dielectric layer 12 are continuous. The material for the dielectric layer 21 may include high-k or low-k materials, such as silicon dioxide ($SiO_2$), silicon nitride ($Si_3N_4$ or $Si_xN_y$), silicon oxynitride ($SiO_xN_y$), and similar materials. In some embodiments, the dielectric layer 21 may serve as the gate dielectric layer for the gate structure 13, so the gate structure 13 does not need an additional gate dielectric layer. In some embodiments, the thickness of the dielectric layer 21 may range between 50 angstroms (Å) and 5000 angstroms.

The current spreading layer 31 is located at the bottom of opening 41 between adjacent gate structures 13. The current spreading layer 31 has a width W31. In some embodiments, the width W31 is approximately the same as the width W412 at the bottom of opening 41. In other words, the current spreading layer 31 may cover the entire bottom of opening 41. In some embodiments, the current spreading layer 31 formed by thermal annealing may extend below the dielectric layer 12, making W31 greater than W412 at the bottom of opening 41. In some embodiments, a top surface of the current spreading layer 31 is positioned above the dielectric layer 12, and a bottom surface of the current spreading layer 31 is positioned below the dielectric layer 12.

In some embodiments, the difference between W31 and W412 is minimal and negligible. In some embodiments, the entire substrate 11 within opening 41 is covered by the current spreading layer 31. In some embodiments, the width W31 of the current spreading layer 31 ranges from 0.1 to 2 micrometers. The vertical power semiconductor structure 1 may comprise multiple current spreading layers 31, with their number corresponding to the number of source doped regions 114. In some embodiments, as shown in FIG. 1A, the current spreading layer 31 extends along the Y direction, with multiple current spreading layers 31 separated from each other and parallel. Additionally, since the heavily doped region 116 aligns with the current spreading layer 31 along the Z direction, the pattern of the current spreading layer 31 shown in FIG. 1A can also represent the pattern of the heavily doped region 116. In some embodiments, the opposite endpoints of the current spreading layer 31 contact the sidewalls of the dielectric layer 12.

The current spreading layer 31 may be a single layer or a multilayer structure. In some embodiments, the current spreading layer 31 includes one or more of the following materials: nickel (Ni), cobalt (Co), titanium (Ti), nickel silicide ($Ni_xSi_y$), cobalt silicide ($Co_xSi_y$), titanium silicide ($Ti_xSi_y$), titanium nitride (TiN), and tantalum nitride (TaN). In some embodiments, the thickness of the current spreading layer 31 ranges from 5 nanometers (nm) to 300 nanometers. In embodiments where the current spreading layer 31 is a multilayer structure, the thickness of each layer within the current spreading layer 31 may be between 5 and 300 nanometers.

The vertical power semiconductor structure 1 may further comprise at least one dielectric layer, such as dielectric layers 22 or 23, covering the dielectric layer 21. The vertical power semiconductor structure 1 may have dielectric layers 22 and 23 stacked sequentially in the Z direction on dielectric layer 21, though this disclosure is not limited to this configuration. In some other embodiments, the vertical power semiconductor structure may comprise only the dielectric layer 22 or may have additional dielectric layers stacked on the dielectric layer 23. Taking the vertical power semiconductor structure 1 as an example, the dielectric layer 22 covers the dielectric layer 21, and part of the dielectric layer 22 may fill in opening 41. In some embodiments, the dielectric layer 22 may contact part of the current spreading layer 31. In some embodiments, the dielectric layer 22 may cover the gate structure 13. In some embodiments, the dielectric layer 23 may cover the dielectric layer 22 and has a relatively flatter top surface compared to the top surface of the dielectric layer 22. The dielectric layers 22 and 23 may be made of the same or different dielectric materials. The materials for the dielectric layers 22 and 23 may include high-k or low-k materials, such as silicon dioxide ($SiO_2$), silicon nitride ($Si_3N_4$ or SixNy), silicon oxynitride (SiOxNy), and similar materials. In some embodiments, the thickness of the dielectric layer 22 may range from 500 angstroms to 20,000 angstroms. In some embodiments, the thickness of the dielectric layer 23 may range from 500 angstroms to 20,000 angstroms, with its thickness may be determined by the depth and specifications of the conductive plug 37. In some embodiments, the dielectric layers 22 and 23 together have an opening 43 to accommodate the conductive plug 37.

The conductive plug 37 comprises a barrier layer 32 surrounding a portion of the dielectric layers 21, 22, and 23, and a metal layer 33 surrounded by the barrier layer 32. In some embodiments, the barrier layer 32 surrounds the metal layer 33 and further covers the top surface of the dielectric layer 23. The metal layer 33 may include one or more metals, such as tungsten (W), aluminum (Al), copper (Cu), aluminum-copper (AlxCuy), their alloys, or combinations thereof. The barrier layer 32 may include one or more metals, such as nickel, cobalt, titanium, titanium nitride, tantalum nitride, their alloys, or combinations thereof. The barrier layer 32 comprises a first portion 321 around the sidewalls and bottom of the metal layer 33, a second portion 322 above the metal layer 33, and a third portion 323 above the dielectric layer 23. Since the third portion 323 on the top surface of the dielectric layer 23 does not have the plug configuration, for simplicity, the conductive plug 37 described here does not include the third portion 323 of the barrier layer 32 on the top surface of the dielectric layer 23. In some embodiments, the conductive plug 37 comprises the first portion 321, the second portion 322, and the metal layer 33. In some embodiments, the conductive plug 37 is positioned between adjacent gate structures 13 and contacts the current spreading layer 31. In some embodiments, the conductive plug 37 is surrounded by the dielectric layers 22 and 23 and separated from the dielectric layer 21. In some embodiments, the conductive plug 37 is separated by dielectric layers 22 and 21. The first, second, and third portions of the barrier layer 32 can be formed through one or multiple deposition steps. It should be noted that, depending on different manufacturing methods, the barrier layer 32 may not include the second portion 322 or/and the third portion 323. For example, in the vertical power semiconductor structure 2 shown in FIG. 25, in some embodiments, the barrier layer 32 does not include the second portion 322, and a source contact layer 35 contacts the metal layer 33. In some embodiments, the thickness of the first portion 321 of the barrier layer 32 in the conductive plug 37 may range from 50 angstroms to 5,000 angstroms. In some embodiments, the thickness of the second portion 322 of the barrier layer 32 in the conductive plug 37 may range from 50 angstroms to 5,000 angstroms. In embodiments with the second portion 322, the thickness of the third portion 323 of the barrier layer 32 may be approximately equal to the thickness of the second portion 322. In embodiments without the second portion 322, the thickness of the third portion 323 of the barrier layer 32 may be approximately equal to the thickness of the first portion 321. In some embodiments, the bottom of the conductive plug 37 is positioned centrally within the opening 41, such that it is positioned at an equal distance from the opposing sidewalls of the dielectric layer 21.

The vertical power semiconductor structure 1 may comprise multiple conductive plugs 37, and the number of conductive plugs 37 corresponds to the number of the current spreading layers 31. In some embodiments, as shown in FIGS. 1A and 1B, the conductive plugs 37 extend along the Y direction and are separated and parallel to each other. In some embodiments, as shown in FIGS. 2 and 3, the opposite endpoints of the conductive plug 37 arranged along the X direction may contact the dielectric layer 12.

Figure 4:
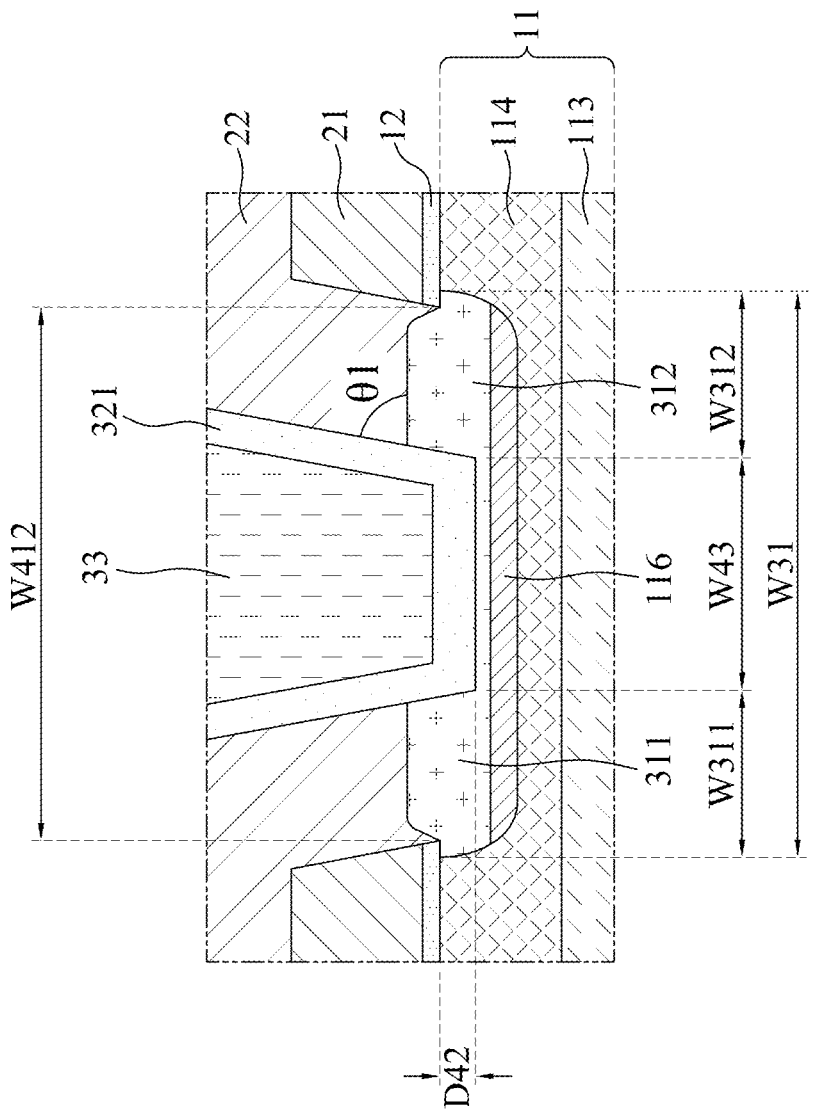
FIG. 4 is a partially enlarged view of FIG. 3 according to some embodiments of the present disclosure.

FIG. 4 is an enlarged cross-sectional view of part of the structure 1B within the dashed box in FIG. 3, created according to some embodiments of this disclosure. In some embodiments, the conductive plug 37 may contact and stop at the top of the current spreading layer 31, as shown in FIGS. 2 and 3. In some other embodiments, the conductive plug 37 may extend into the current spreading layer 31, as shown in FIG. 4, increasing the contact area between the conductive plug 37 and the current spreading layer 31, thereby reducing resistance and minimizing current crowding effects (CCE). In some embodiments, the bottom surface of the conductive plug 37 (i.e., the bottom surface of the first portion 321 of the barrier layer 32) may be below the surface 11A of the substrate 11. In some embodiments, the bottom surface of the conductive plug 37 is located along the Z direction between surface 11A and surface 11B of substrate 11, and the distance D42 between the bottom surface of the conductive plug 37 and surface 11A may range from 0.01 to 0.5 micrometers. The sidewalls of the conductive plug 37 may be vertical, inclined, or curved. In some embodiments, the angle θ1 between the sidewalls of the conductive plug 37 and the top surface of the current spreading layer 31 may range from 45 to 90 degrees.

The bottom of the conductive plug 37 has a width W43, which is smaller than the width W31 of the current spreading layer 31. The width of the current spreading layer 31 may be approximately the same as the width at the bottom of opening 41, and the conductive plug 37 is separated from the dielectric layer 21 by the dielectric layer 22. In some embodiments, the conductive plug 37 is approximately centered on the current spreading layer 31 along the X direction. In some embodiments, the current spreading layer 31 comprises a first portion 311 and a second portion 312 on opposite sides of the conductive plug 37 along the X direction. The first portion 311 and the second portion 312 of the current spreading layer 31 extend from the sidewalls of the conductive plug 37 to the opposite sidewalls of opening 41 (or the sidewalls of the dielectric layer 21). In some embodiments, the width W311 of the first portion 311 in the X direction (i.e., the distance between the sidewall of the conductive plug 37 and the sidewall of the dielectric layer 21) is approximately equal to the width W312 of the second portion 312 in the X direction (i.e., the distance from the opposite sidewall of the conductive plug 37 to the opposite sidewall of the dielectric layer 21). In other words, the width W311 of the first portion 311 or the width W312 of the second portion 312 is approximately half of the difference between the width W31 of the current spreading layer 31 and the width W43 of the bottom of the conductive plug 37 (i.e., (W31-W43)/2). In some embodiments, the width W311 of the first portion 311 or the width W312 of the second portion 312 may range from 0.1 to 1 micrometer. In some embodiments, the ratio of the width W311 of the first portion 311 to the width W43 of the bottom of the conductive plug 37 (i.e., W311/W43) may range from 0.1 to 10. Similarly, in some embodiments, the ratio of the width W312 of the second portion 312 to the width W43 of the bottom of the conductive plug 37 (i.e., W312/W43) may range from 0.1 to 10.

The vertical power semiconductor structure 1 further comprises a source contact layer 35 and a drain contact layer 36 on opposite sides of substrate 11. The source contact layer 35 is located above surface 11A of the substrate 11 and is electrically connected to the conductive plug 37. The drain contact layer 36 is located over surface 11B of substrate 11, and in some embodiments, the drain contact layer 36 may contact surface 11B of substrate 11. The source contact layer 35 and the drain contact layer 36 may include the same or different metallic materials, such as aluminum, copper, aluminum-copper, their alloys, or combinations thereof. Depending on the specifications of the product, the metal layer 33 and the source contact layer 35 may be of the same or different metals. In embodiments where the opening 43 is smaller in size, the metal layer 33 may use metals like tungsten or other materials with good filling capability, whereas the source contact layer 35 can use metals like aluminum, copper, or aluminum-copper since filling capability is not an issue. In embodiments where the opening 43 is larger in size, the metal layer 33 and the source contact layer 35 may use the same material and may even be formed simultaneously in a single step. In embodiments where the metal layer 33 and the source contact layer 35 are formed simultaneously in a single step, the metal layer 33 and the source contact layer 35 are formed as an integrated structure, meaning the barrier layer 32 will not include the second portion 322. For example, in the vertical power semiconductor structure 3 shown in FIG. 26, in some embodiments, the barrier layer 32 does not include the second portion 322, and the source contact layer 35 and the metal layer 33 are of the same metal material. In some embodiments, the thickness of the source contact layer 35 on the dielectric layer 23 may range from 1 to 10 micrometers. The vertical power semiconductor structure 1 further comprises a drain. In some embodiments, the drain is located near or at the bottom side of the substrate 11 (surface 11B). The drain contact layer 36 interfaces directly with the drain, providing a low-resistance electrical pathway and facilitating external connections.

In conventional vertical power semiconductor devices, when forming a plug trench, a metal silicide layer is first formed at the bottom of the trench, followed by the formation of a metal plug in the trench to achieve the effect of reducing interface resistance. However, as technology advances and product dimensions are reduced, conventional vertical power semiconductor devices face challenges in further lowering interface resistance and the device's overall resistance. In the structure where the metal silicide aligns with the metal plug, current crowding effects often occur at the trench's bottom (where the metal plug meets the metal silicide at the trench bottom), leading to reduced reliability of the vertical power semiconductor device.

The vertical power semiconductor structure provided by this disclosure has a vertical current conduction path, where current flows from the source contact layer 35 through the conductive plug 37, the current spreading layer 31, the channel (the substrate 11 beneath the gate structure 13), and finally to the drain contact layer 36. Positioned between the conductive plug 37 and the substrate 11, the current spreading layer 31 helps reduce the interface barrier height, which aids in lowering the resistance of the vertical power semiconductor structure 1. Compared to traditional metal silicide, the current spreading layer 31 has first portion 311 and second portion 312, extending from the bottom of the conductive plug 37 toward the gate structures 13. This design reduces interface resistance and provides a current conduction path with lower resistance than the substrate 11, extending beyond the conductive plug 37 without changing its specifications, thereby improving the resistance and reliability of the vertical power semiconductor structure.

Furthermore, in recent years, silicon carbide has been introduced as a substrate material for power semiconductor devices. Traditional manufacturing methods for metal silicide structures do not integrate well with silicon carbide substrates. Metal silicide structures made using conventional methods may suffer from voids and carbon precipitation, leading to instability in resistance values and reduced product reliability. This disclosure provides an exemplary manufacturing method 700 for forming the vertical power semiconductor structure 1, which includes a multi-step annealing process and multilayer composite metal materials to form the current spreading layer 31, thus addressing the issues of void formation and carbon precipitation. This manufacturing method 700 is well-suited for integration with silicon carbide substrates.

Figure 5:
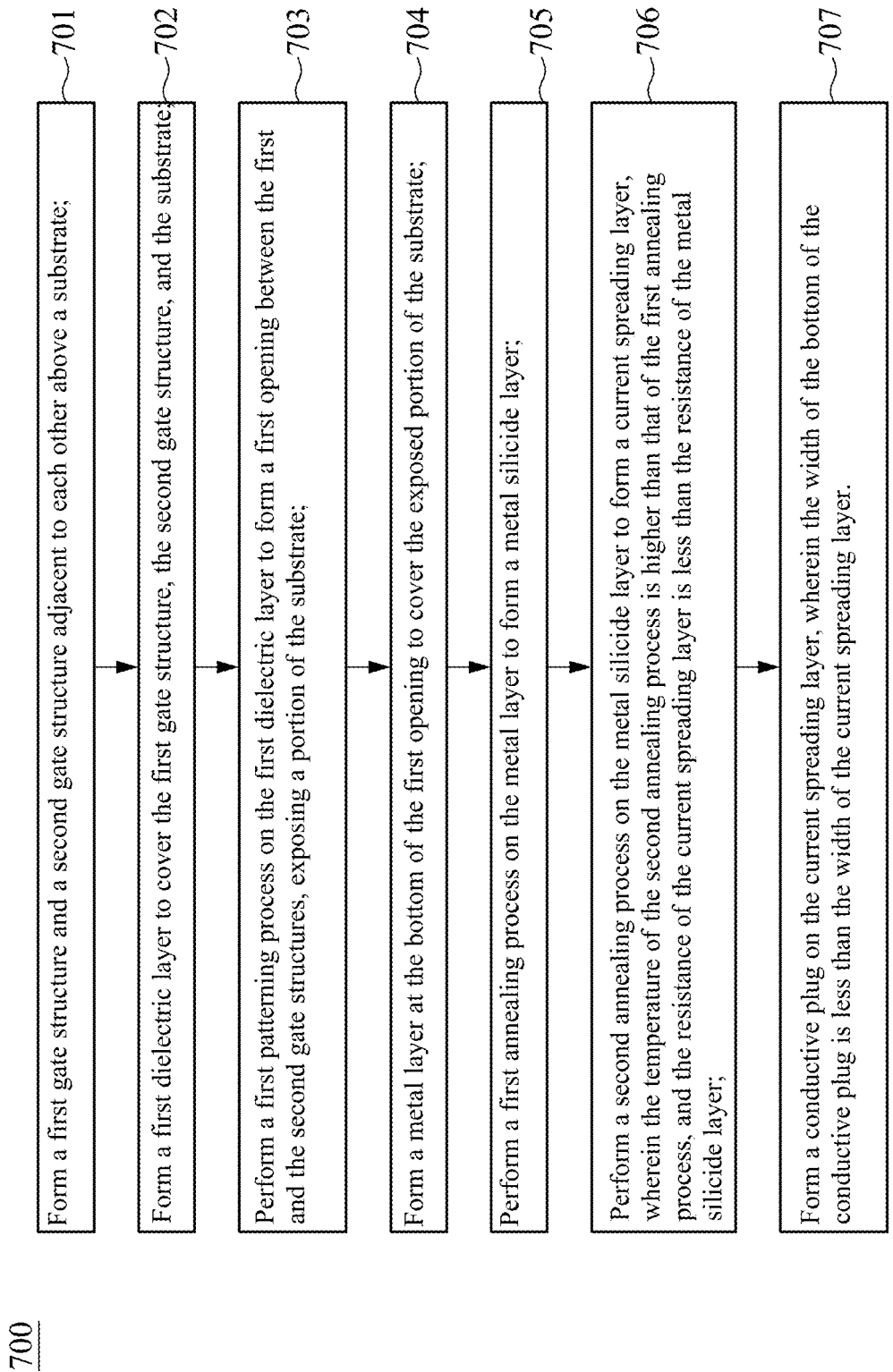
FIG. 5 is a flowchart of a manufacturing method according to some embodiments of the present disclosure.

FIG. 5 is a flowchart of an exemplary manufacturing method 700 associated with forming the vertical power semiconductor structure 1. The method 700 comprises multiple steps (e.g., steps 701, 702, 703, 704, 705, 706, and 707). In some embodiments, different dielectric layers are used to define the current spreading layer 31 and the conductive plug 37, ensuring that the width W31 of the current spreading layer 31 is greater than the width W43 of the bottom of the conductive plug 37, thereby achieving the extended low-resistance current conduction path. In some embodiments, a multi-step annealing process and multilayer composite metal materials are used to form the current spreading layer 31, thus reducing void formation and avoiding carbon precipitation.

FIGS. 6 through 22 illustrate one or more stages in the manufacturing method 700 for the vertical power semiconductor structure 1 according to various embodiments of this application. It should be noted that FIGS. 6 through 22 are cross-sectional structures at different stages along line A-A' in FIGS. 1A and 1B, as examples of the exemplary embodiments, but this disclosure is not limited to these. At least some of these drawings have been simplified for a better understanding of the aspects of this disclosure. Note that the manufacturing method 700 may comprise additional embodiments, such as any single embodiment or any combination of embodiments described below and/or elsewhere in this disclosure.

Figure 6:
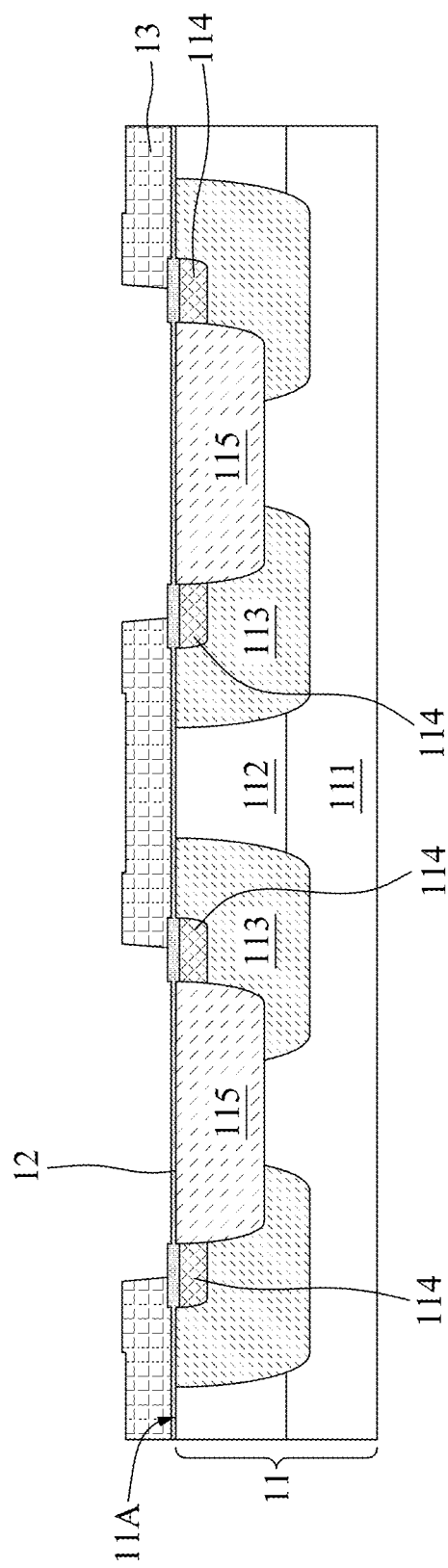
FIG. 6 to FIG. 21 illustrate one or more stages in the manufacturing method of the vertical power semiconductor structure according to some embodiments of the present disclosure.

Referring to FIG. 6, corresponding to step 701 of the manufacturing method 700, the method 700 comprises forming multiple gate structures 13 on surface 11A of the substrate 11. Multiple doped regions 111, 112, 113, 114, and 115 in the substrate 11 may be formed through multiple ion implantation processes in combination with photolithography layers or mask layers with different patterns, creating doped regions with different depths, concentrations, coverage areas, and conductivity types. Before forming the gate structures 13, the manufacturing method 700 may further comprise forming a dielectric layer 12 on surface 11A of the substrate 11. In some embodiments, forming the gate structure 13 involves performing one or more etching processes on the material layer for the gate structure 13 (e.g., the gate electrode layer, sidewall spacers, etc., as described above) to define the position and configuration of the gate structure 13. In some embodiments, this etching process may not remove the dielectric layer 12. In some embodiments, after step 701, the dielectric layer 12 covers parts of surface 11A of the substrate 11 outside the gate structure 13.

Figure 7:
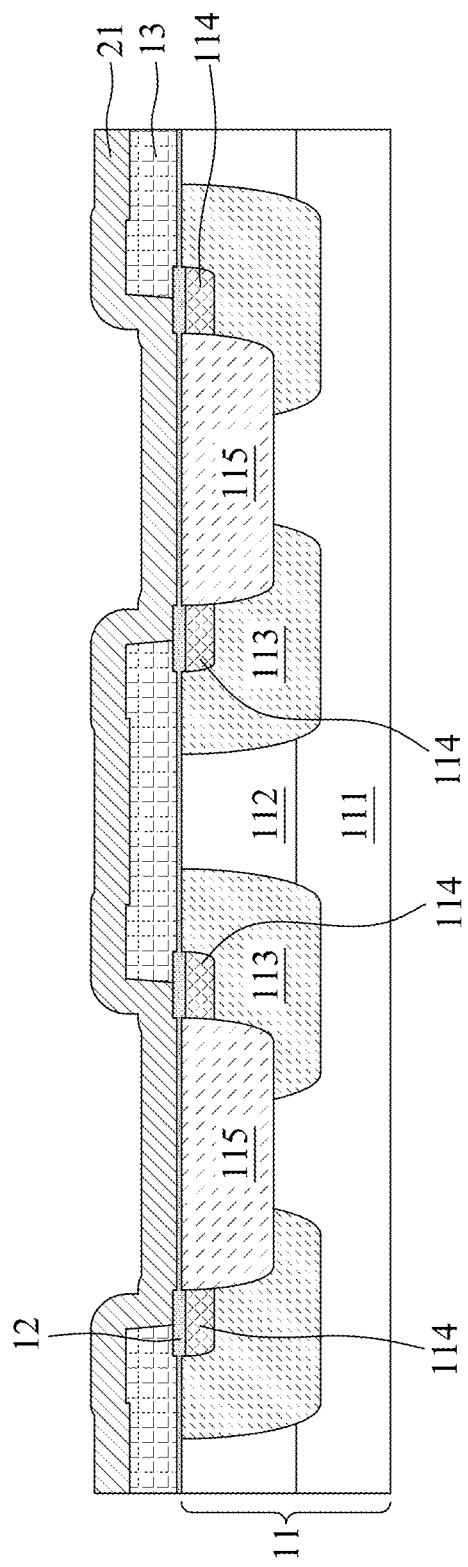

Referring to FIG. 7, corresponding to step 702 of manufacturing method 700, the method 700 further comprises forming a dielectric layer 21 over the gate structure 13, covering both the gate structure 13 and the substrate 11. In some embodiments, after step 701, a deposition process is performed on surface 11A of the substrate 11 to form dielectric layer 21. The dielectric layer 21 covers multiple gate structures 13 and the dielectric layer 12. In some embodiments, the contour of the dielectric layer 21 aligns with the contours of the gate structure 13 and the dielectric layer 12. In some embodiments, the dielectric layer 21 may conformally cover the gate structure 13 and the dielectric layer 12.

Figure 8:
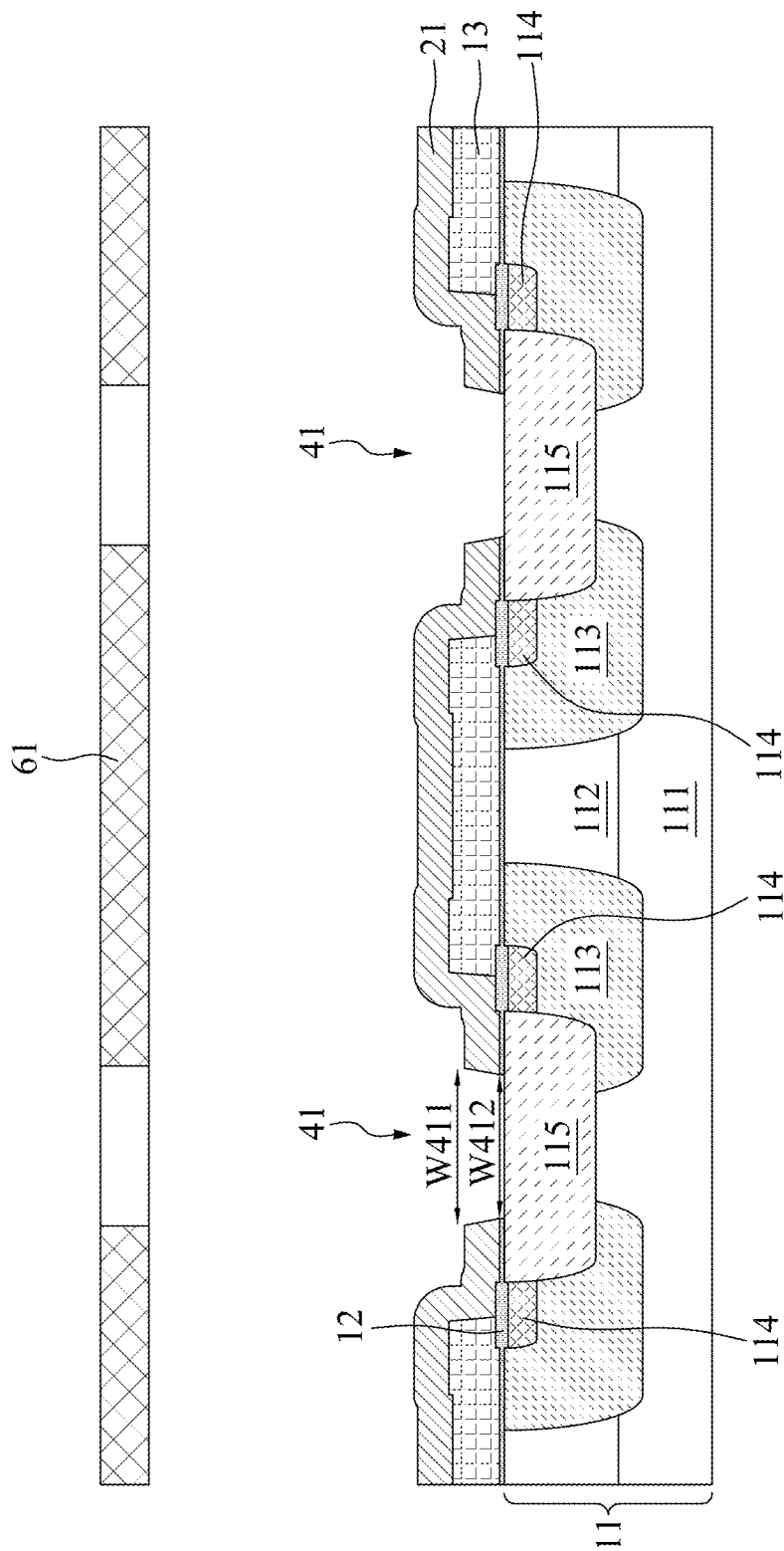

Referring to FIG. 8, corresponding to step 703 of manufacturing method 700, the method 700 further comprises performing a first patterning process on the dielectric layer 12 and the dielectric layer 21 to form an opening 41 between adjacent gate structures 13, where opening 41 exposes part of surface 11A of substrate 11. In some embodiments, before the first patterning process, a mask layer (not shown in the figure) with a pattern defined by photomask 61 is formed on dielectric layer 21. In some embodiments, the dielectric layers 12 and 21 have a low etching selectivity ratio with respect to the etchant used in the first patterning process, allowing both dielectric layers 12 and 21 to be removed in a single etching step to form opening 41. In some other embodiments, the dielectric layers 12 and 21 have a high etching selectivity ratio with respect to a single etchant in the first patterning process, so the same mask layer can be used as a mask to etch dielectric layers 12 and 21 separately, forming opening 41. In some embodiments, the sidewalls of opening 41 are defined jointly by patterned dielectric layers 12 and 21. The sidewalls of opening 41 may be vertical, sloped, or curved, but because they could be defined by the same photomask 61 and mask layer, the sidewalls of opening 41 are continuous and/or smooth, without any step-like difference at the interface of dielectric layers 12 and 21. In some embodiments, the top width W411 of opening 41 may be greater than the bottom width W412 of opening 41. In some other embodiments, the top width 411 of opening 41 may be approximately equal to the bottom width 412 of opening 41.

The purpose of retaining the dielectric layer 12 until it is removed together with the dielectric layer 21 is to minimize the exposure of the substrate 11 to other etching or cleaning steps. In different embodiments, a spacer material layer may be formed to cover the gate electrode layer after etching the gate electrode layer of gate structure 13, followed by etching the spacer material layer to form sidewall spacers. If the dielectric layer 12 is removed during the etching of the gate electrode layer or the spacer material layer, the substrate 11 could be exposed to these etching or subsequent cleaning steps, which could damage surface 11A (particularly areas adjacent to the source doped region 114). Removing the dielectric layer 12 during the etching of the dielectric layer 21 reduces the likelihood of surface 11A of the substrate 11 being damaged.

The exposed surface 11A of opening 41 defines the location for forming the subsequent current spreading layer 31. FIGS. 9 through 14 illustrate various stages in the formation of current spreading layer 31. To achieve a low resistance value and good current conduction for the current spreading layer 31, its formation may include multiple ion implantation steps and multiple thermal annealing steps at different temperatures.

Figure 9:
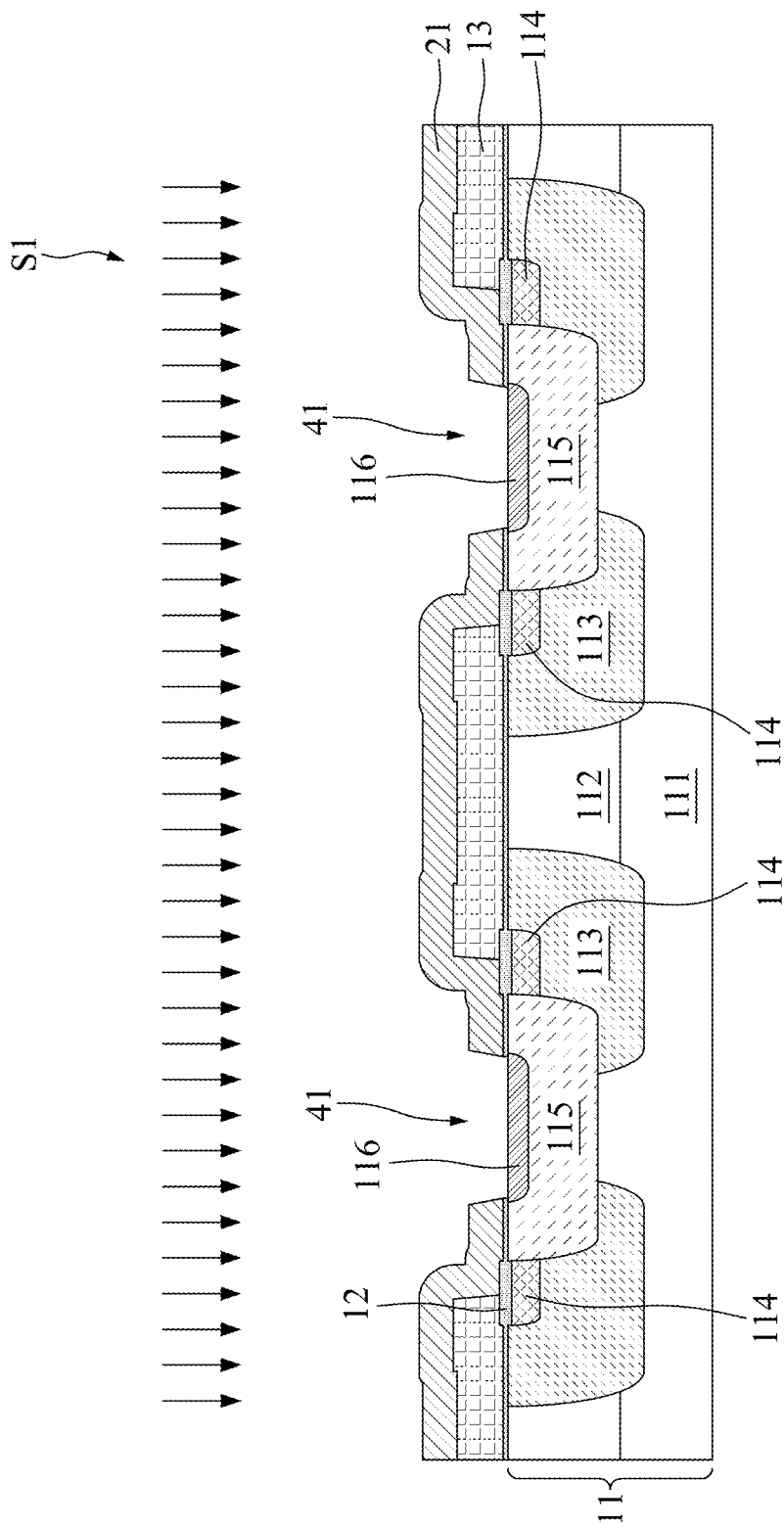

Referring to FIG. 9, before step 704, manufacturing method 700 may further comprise performing an ion implantation process S1 on the part of the substrate 11 exposed by opening 41 to form a heavily doped region 116. The purpose of forming the heavily doped region 116 is to reduce the barrier height between the metal material and substrate 11, particularly when the substrate 11 is made of silicon carbide. When silicon carbide bonds with implanted ions and forms defects, it can reduce the energy barrier and contact resistance through the mechanism of trap-assisted tunneling (TAT). Therefore, the ions used in ion implantation process S1 are of the first conductivity type, and the heavily doped region 116 is a shallow doped region with the same conductivity type as the source doped region 114. In some embodiments, the doping concentration of heavily doped region 116 may be greater than the doping concentration of the source doped region 114. In some embodiments, the temperature range for ion implantation process S1 is between 15° C. and 100° C. In some embodiments, the energy range for ion implantation process S1 is between 15 keV and 80 keV. In some embodiments, the ion dose range for ion implantation process S1 is between 5E13 $cm^{-2}$ and 5E16 $cm^{-2}$.

Figure 10:
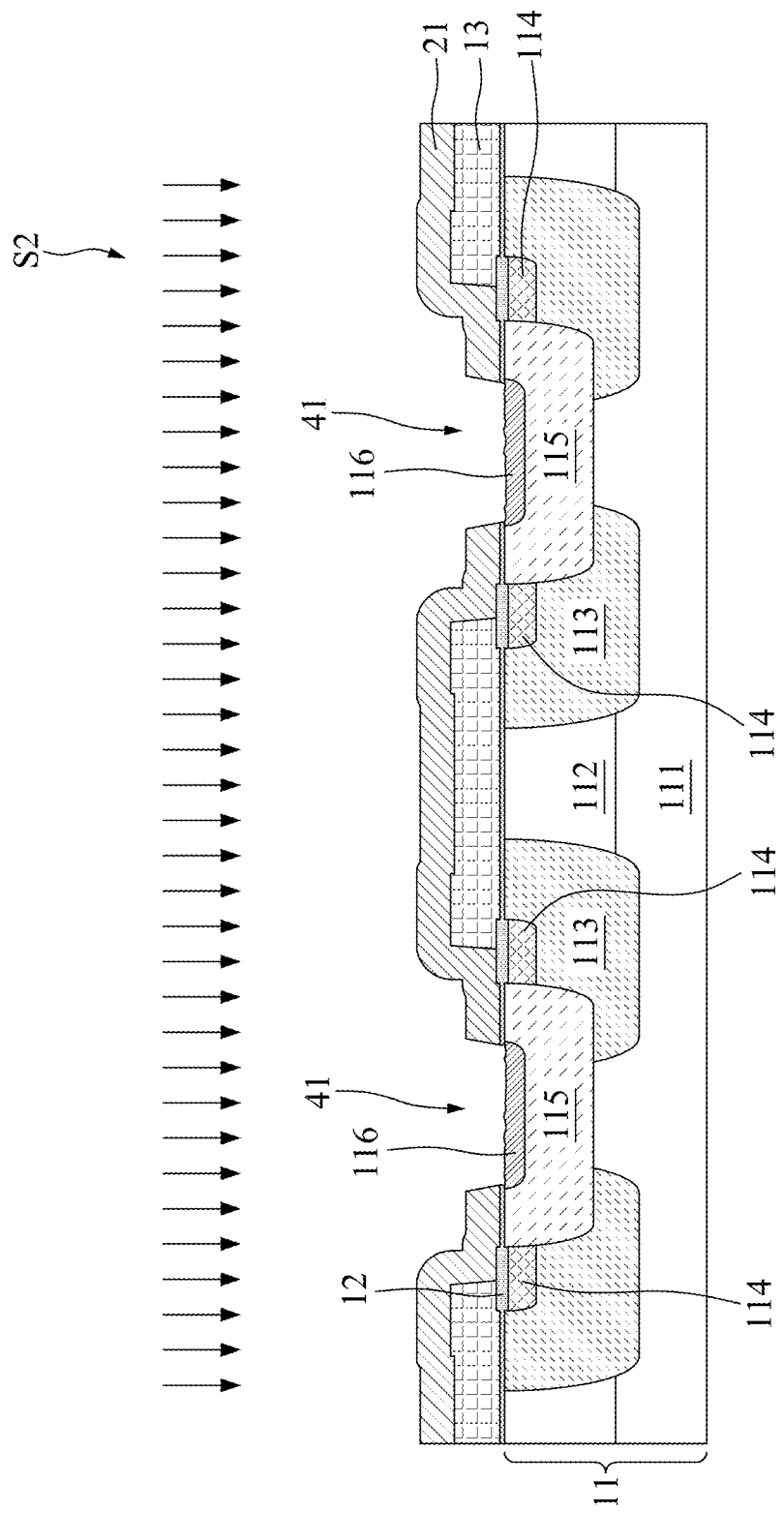

Referring to FIG. 10, before or after ion implantation process S1, and before step 704, manufacturing method 700 may further comprise performing an ion bombardment process S2 on the exposed substrate 11 to increase the surface roughness of the exposed portion of the substrate 11 (reducing grain size). To effectively increase the surface roughness of the substrate 11 without significantly changing the dopant concentration in substrate 11, ion bombardment process S2 uses inert gas ions. In some embodiments, the ions used in ion bombardment process S2 are larger or heavier than those used in ion implantation process S1. Although ion implantation process S1 may increase the surface roughness of substrate 11, its main purpose is to create defects, whereas ion bombardment process S2 ensures that the exposed surface 11A of the substrate 11 has greater surface roughness, enhancing surface contact area and reaction rate, which is beneficial for the subsequent formation of the current spreading layer 31. In some embodiments, ion bombardment process S2 may be performed after ion implantation process S1, allowing better control of the ion implantation depth, reducing or avoiding the risk of unstable ion implantation depth. Additionally, as described above, defects in silicon carbide help reduce the energy barrier and contact resistance, and ion bombardment process S2 facilitates an increase in defect density, thereby enhancing the effect of trap-assisted tunneling.

Figure 11:
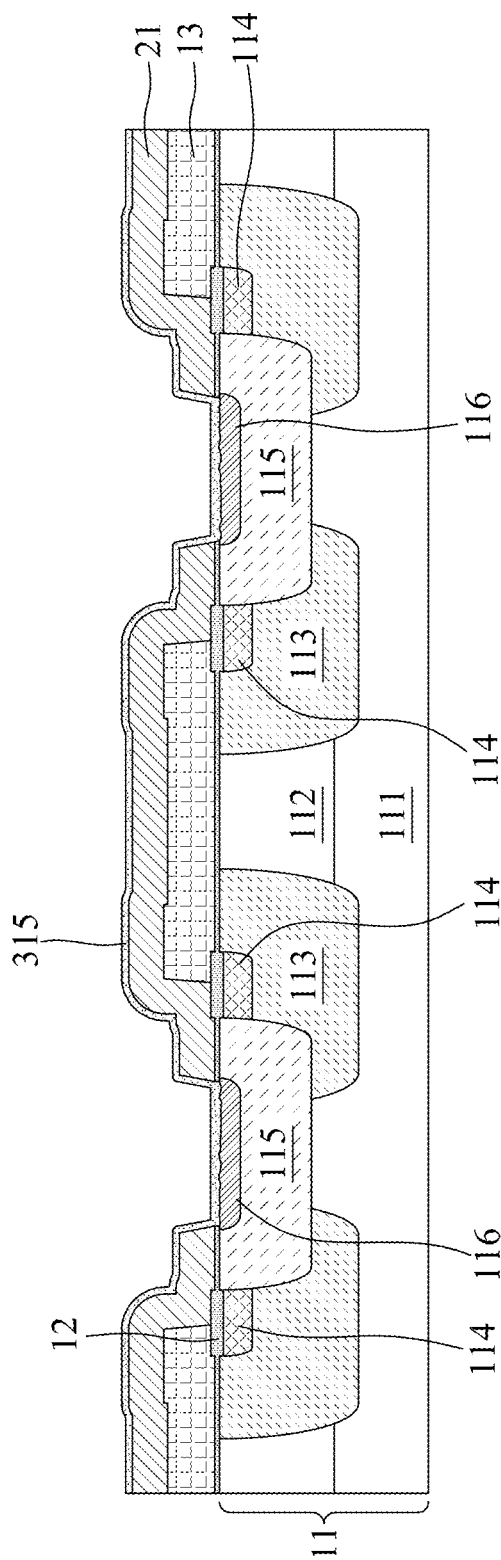

Referring to FIG. 11, corresponding to step 704 of manufacturing method 700, the method 700 further comprises forming a metal layer 315 on the first dielectric layer 21, covering at least the exposed substrate 11 in opening 41. The metal layer 315 is formed by a deposition process as a single layer or multiple layers of metal material. In some embodiments, when the material of the substrate 11 is silicon carbide, metal layer 315 is a composite formed by sequentially depositing and stacking multiple different metal materials. In subsequent steps, the metal layer 315 will transform into metal silicide via a thermal annealing process. The metal silicide formed from the composite metal layer 315 has fewer voids and avoids carbon precipitation compared to a single-metal-layer metal silicide.

Figure 12:
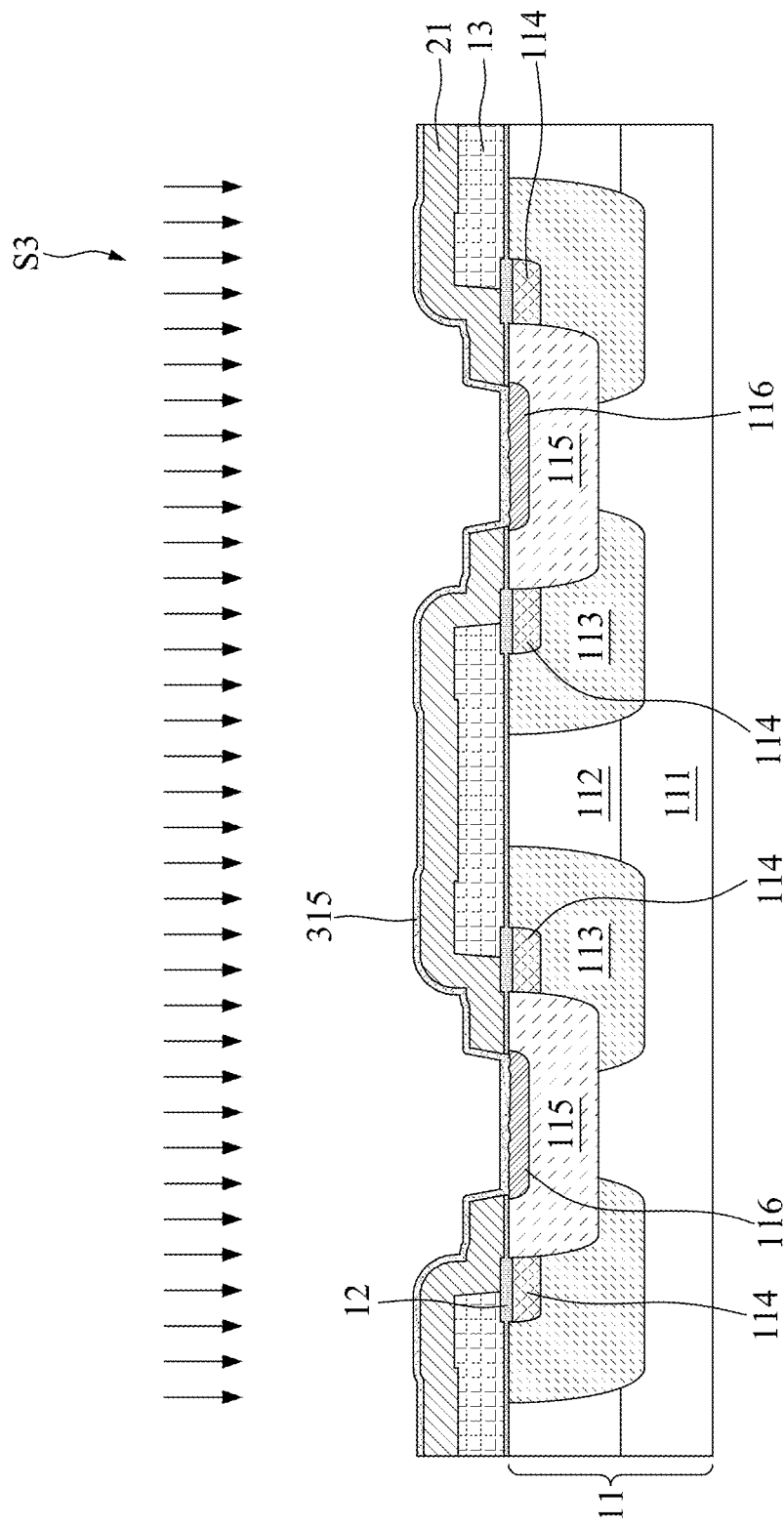

Referring to FIG. 12, before step 705, manufacturing method 700 may further comprise an ion implantation process S3 on the metal layer 315. In ion implantation process S3, ions identical to the semiconductor material of the substrate 11 may be used to implant into the metal layer 315. In some embodiments, ion implantation process S3 uses at least one element from groups III to V. Gas ions that do not affect the conductivity type of the substrate 11 may also be used in ion implantation process S3 for implantation into metal layer 315. In some embodiments, inert gas ions may be used in ion implantation process S3 for implantation into metal layer 315. When silicon carbide is used as the substrate 11, as mentioned above, during the formation of metal silicide, carbon ions in the silicon carbide can precipitate, affecting the resistance value and reliability of the resulting metal silicide. Ion implantation process S3 can reduce the grain size of the metal layer 315, which is beneficial for the formation of metal silicide, and is thus also referred to as nucleation-assisting implant. Furthermore, research by the inventors has shown that ion implantation process S3 can further mitigate carbon precipitation issues.

Figure 13:
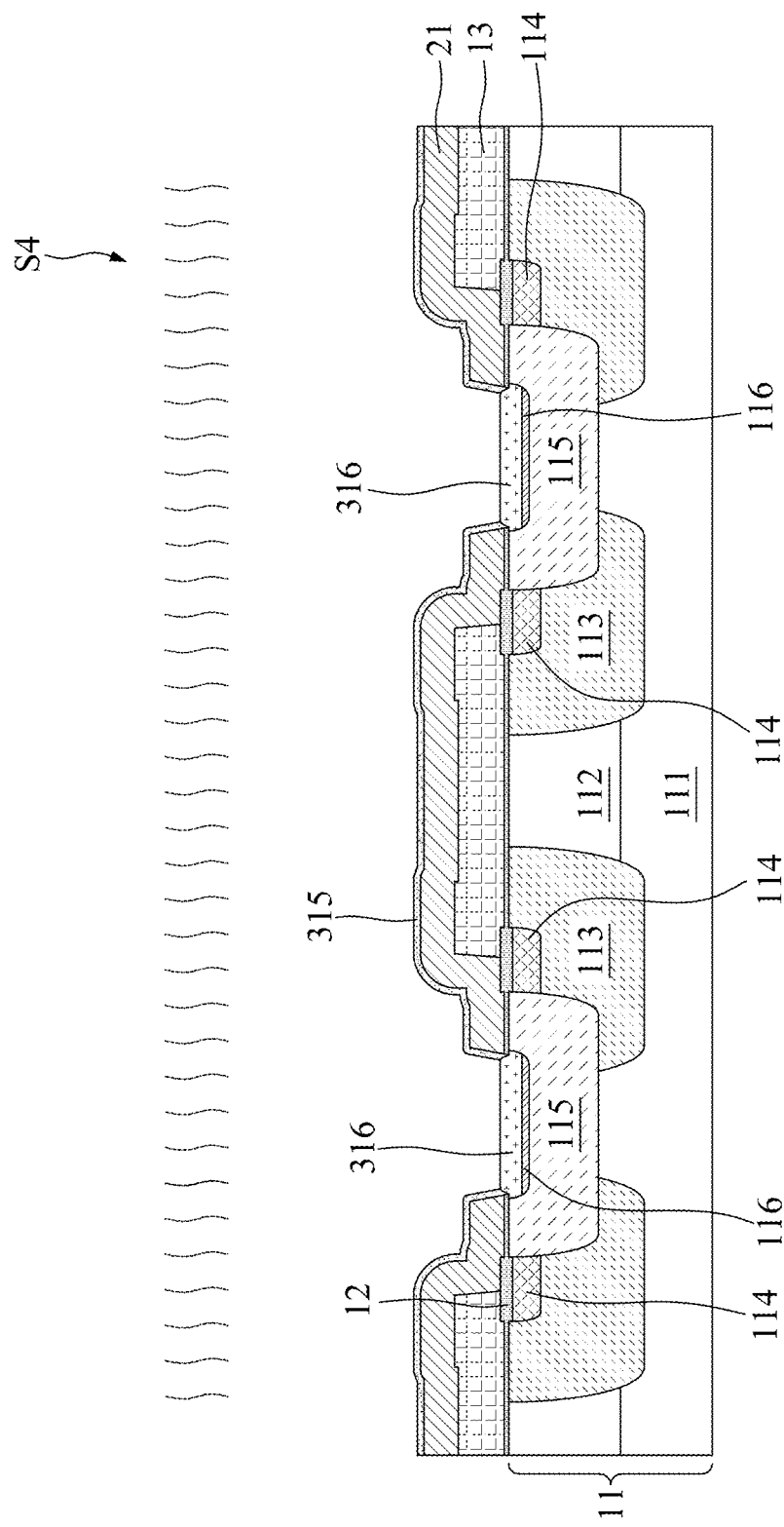

Referring to FIG. 13, corresponding to step 705 of manufacturing method 700, the method 700 further comprises performing a first annealing process S4 on the metal layer 315 to form a metal silicide layer 316. In some embodiments, the temperature range of the first annealing process S4 is between 550° C. and 800° C. The temperature of the first annealing process S4 is sufficient for the metal layer 315 to react with the substrate 11, causing the portion of the metal layer 315 in contact with the substrate 11 and the portion of the substrate 11 in contact with metal layer 315 to form the metal silicide layer 316. In some embodiments, part of the substrate 11 within the heavily doped region 116 reacts to form the metal silicide layer 316. In other embodiments, the entire substrate 11 within heavily doped region 116 reacts to form the metal silicide layer 316.

Figure 14:
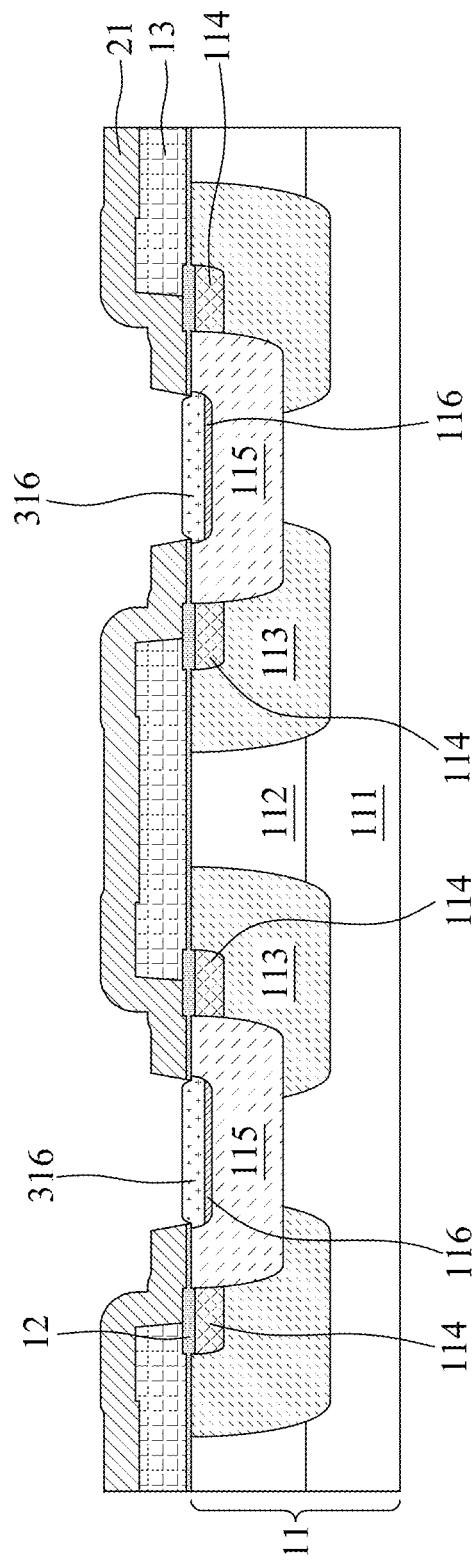

Referring to FIG. 14, after step 705, manufacturing method 700 may further comprise removing the metal layer 315 that is not converted into the metal silicide layer 316. The portion of the metal layer 315 covering the dielectric layer 21 does not form metal silicide as it is separated from the substrate 11. In some embodiments, an etching process is used to remove the unreacted metal layer 315.

Figure 15:
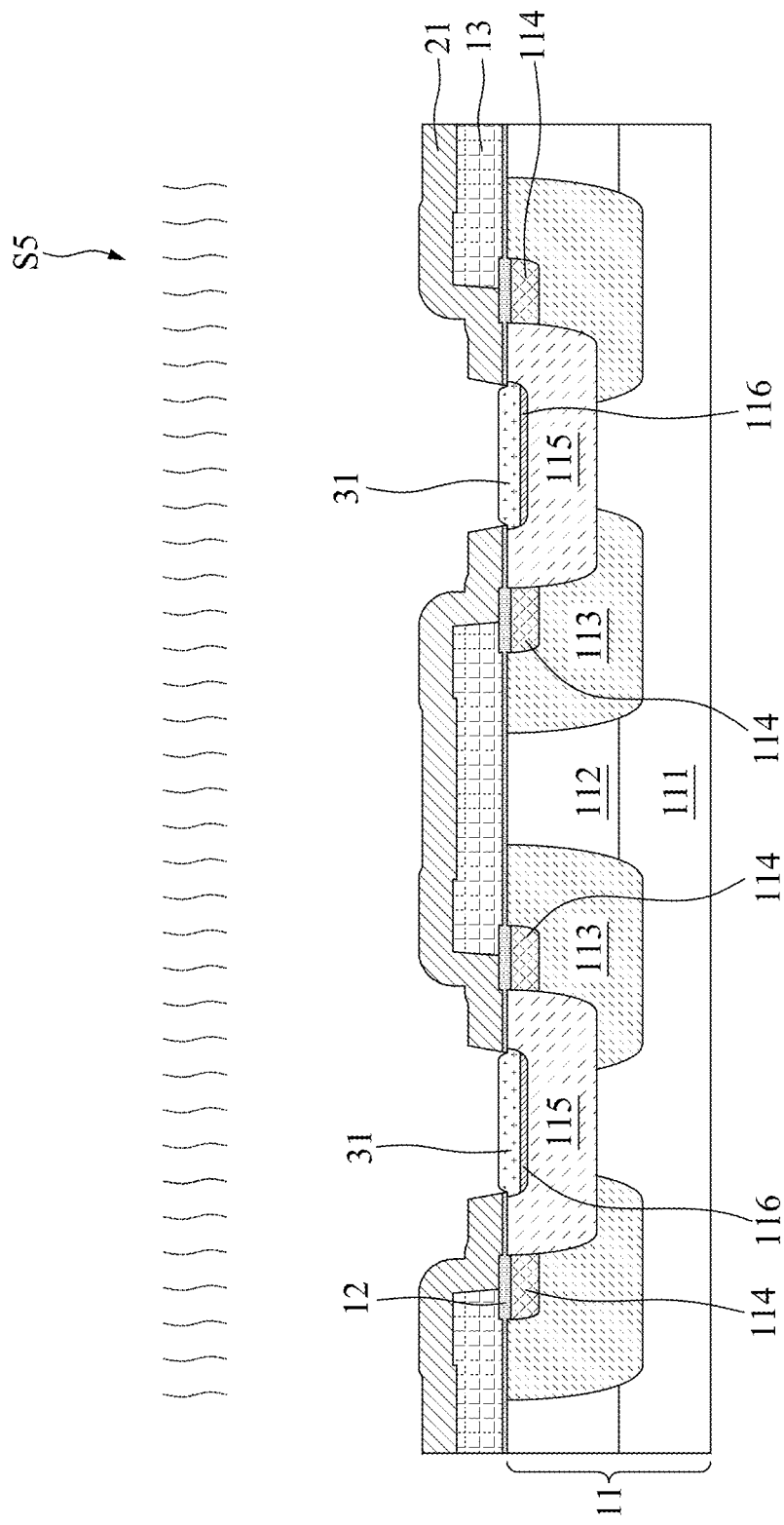

Referring to FIG. 15, corresponding to step 706 of manufacturing method 700, the method 700 further comprises performing a second annealing process S5 on the metal silicide layer 316 to form a current spreading layer 31. The temperature of the second annealing process S5 is higher than that of the first annealing process S4. In some embodiments, the temperature range for the second annealing process S5 is between 700° C. and 1000° C. The purpose of the second annealing process S5 is to adjust the phase of the metal silicide. Although the temperature of the first annealing process S4 is sufficient to form metal silicide, the phase of the formed the metal silicide layer 316 has a higher resistance value. The second annealing process S5, with a higher temperature, adjusts the phase of the metal silicide to a phase with a lower resistance value. In some embodiments, the resistance value of the current spreading layer 31 is lower than that of the metal silicide 316. In some embodiments, the duration of the second annealing process S5 ranges from 30 to 90 seconds.

Conventional metal silicide formation procedures include a single high-temperature thermal annealing process (generally with a temperature range between 950° C. and 1150° C. and a total duration exceeding 90 seconds) to directly form a low-resistance-phase metal silicide. Compared to the two-step thermal annealing procedure of this disclosure, conventional procedures have a higher thermal budget, which also results in the substrate 11 being subjected to high-temperature environments for longer periods. Silicon carbide substrates are less suitable for high-temperature processes than silicon-based substrates, so conventional metal silicide formation procedures are less suitable for silicon carbide substrates, limiting the choice of substrate materials. Furthermore, the two-step thermal annealing process of this disclosure has a lower thermal budget compared to conventional single high-temperature thermal annealing processes. The higher the thermal budget of an annealing process (especially for high-temperature annealing), the more likely metal silicide is to grow along the surface of the substrate, increasing the likelihood of leakage currents. Using the structure in FIG. 13 as an example, if the conventional single high-temperature thermal annealing process is used instead of the two-step process disclosed here, metal silicide may form not only in the position of the metal silicide layer 316 in FIG. 13 but may also grow further along surface 11A of the substrate 11 in the direction of gate structures 13, increasing the chance of leakage currents. In contrast, the lower thermal budget of this disclosure's two-step thermal annealing process helps prevent leakage currents. Additionally, the thermal budget is a factor that affects carbon precipitation. This disclosure's lower thermal budget compared to conventional thermal annealing processes further helps mitigate carbon precipitation issues.

Figure 16:
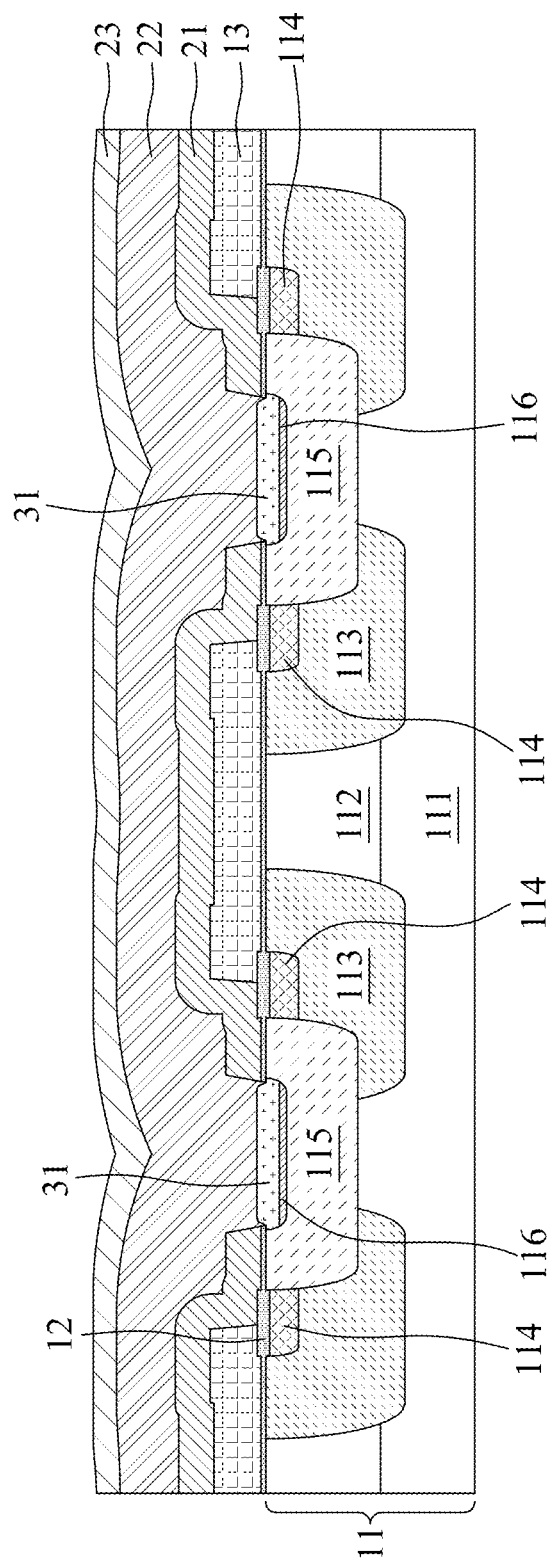

Referring to FIG. 16, after step 706 and before step 707, manufacturing method 700 may further comprise forming at least one dielectric layer (e.g., dielectric layers 22, 23) covering the current spreading layer 31 and the dielectric layer 21. The dielectric layer 22 fills the opening 41 shown in FIG. 16. In some embodiments, the dielectric layer 22 contacts the upper surface of the current spreading layer 31. In some embodiments, the dielectric layer 23 covers the top surface of the dielectric layer 22. In some embodiments, the dielectric layer 23 is positioned above opening 41 and separated from it. The dielectric layer 23 can be optional or formed to provide a flatter surface for subsequent processing, allowing for other dielectric layers to be selectively formed on top. In some embodiments, the top surface of the dielectric layer 23 may be smoother than that of the dielectric layer 22.

FIGS. 17 to 20 illustrate several stages in the formation of the conductive plug 37 (corresponding to step 707). In some embodiments, the conductive plug 37 may consist of various conductive materials.

Figure 17:
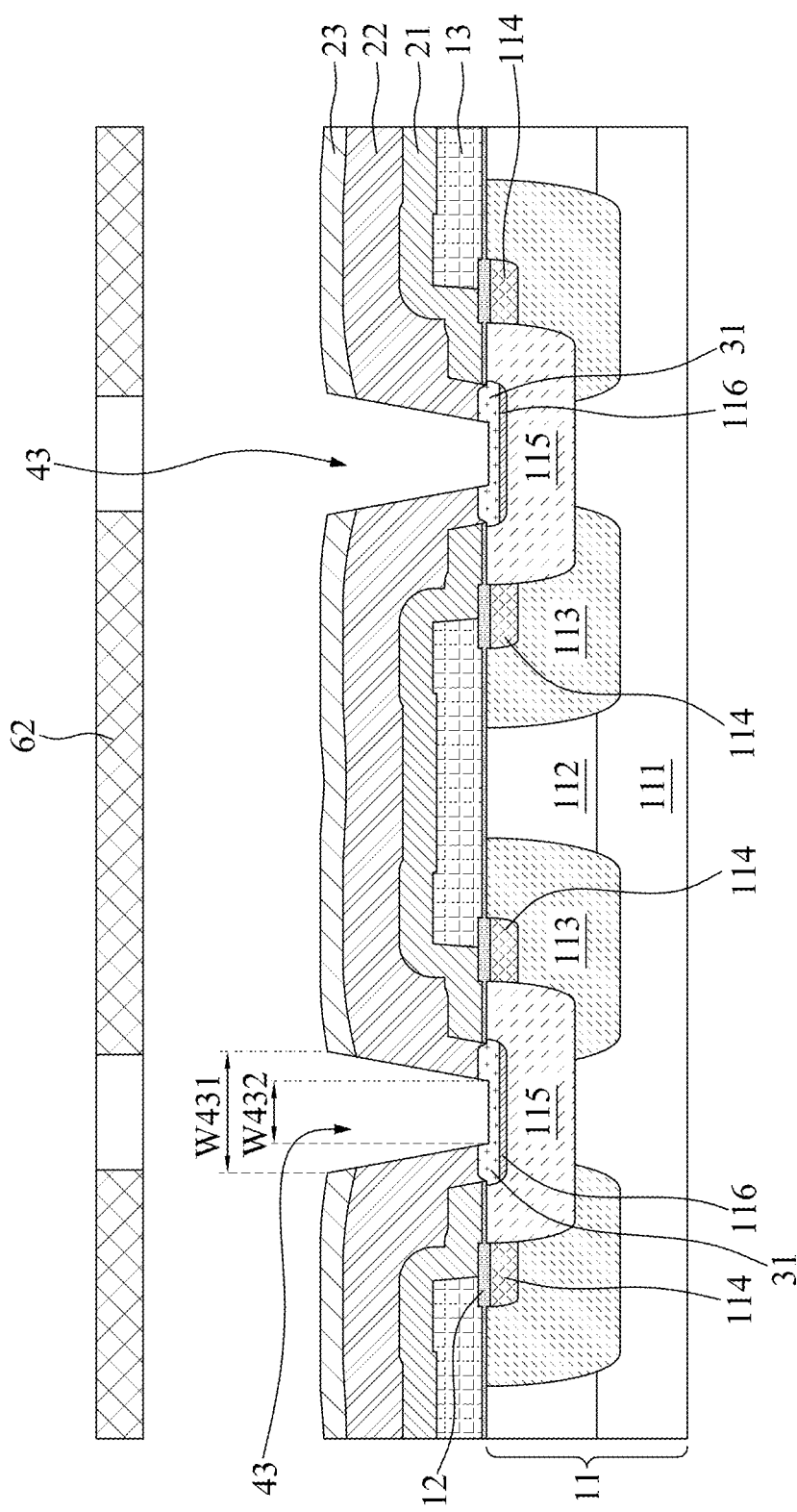
Figure 18:
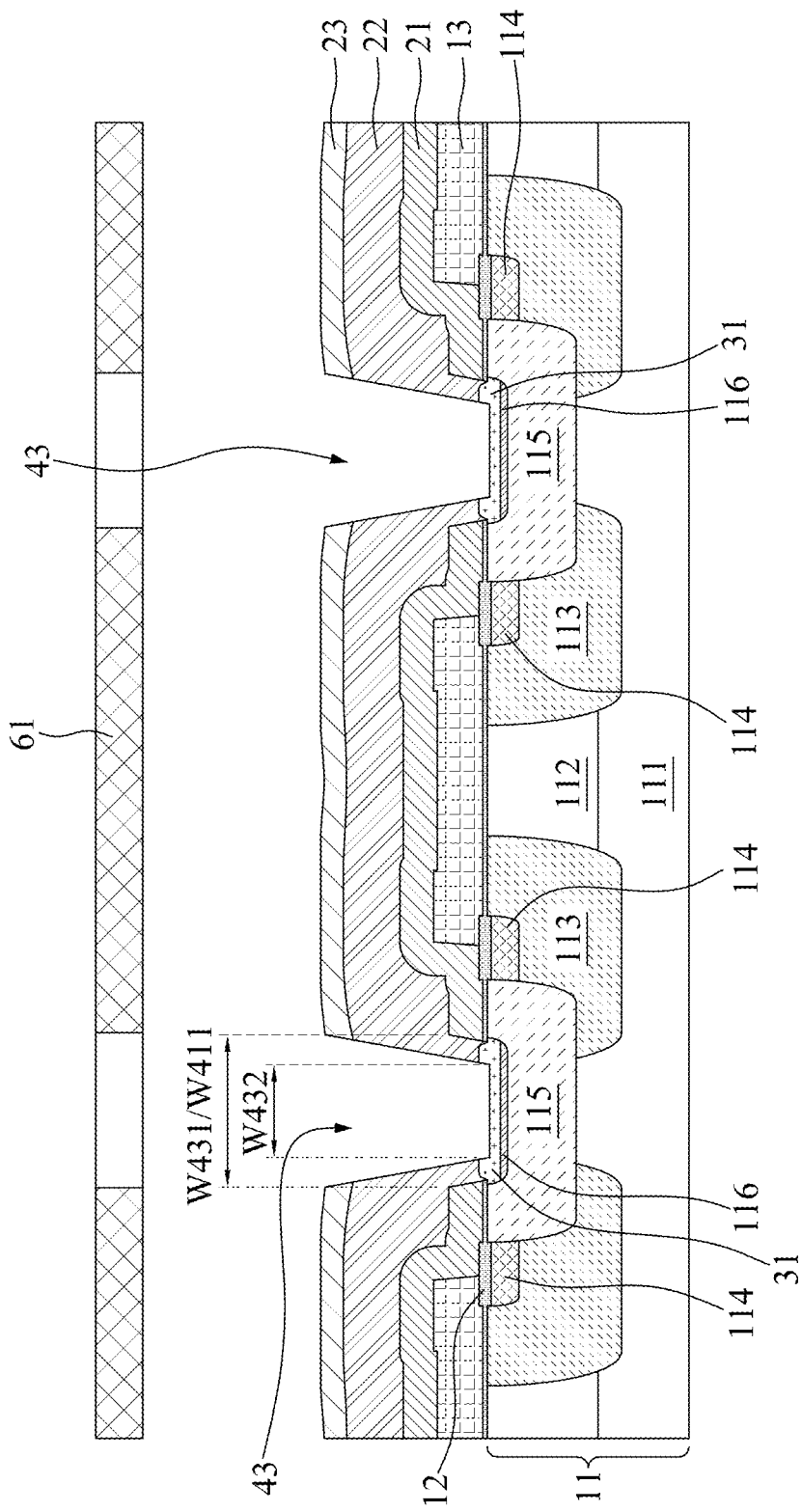

Referring to FIGS. 17 and 18, manufacturing method 700 may further comprise performing a second patterning process on at least one dielectric layer (e.g., dielectric layers 22, 23) to form an opening 43 between adjacent gate structures 13, exposing a portion of the current spreading layer 31. Opening 43 defines the position for the subsequent formation of the conductive plug 37. To ensure that the conductive plug 37 is fully placed over the current spreading layer 31, the bottom width W432 of opening 43 should be smaller than the bottom width W412 of opening 41 shown in FIG. 8. Details of the second patterning process can be referenced from the explanation of FIG. 8 and will not be repeated here. In some embodiments, the dielectric layers 22 and 23 may be made of the same dielectric material and can be removed together in a single etching process. In other embodiments, the dielectric layers 22 and 23 may be composed of different dielectric materials, allowing them to be removed with a multi-step etching process using the same mask layer as the mask. In some embodiments, opening 43 is defined by the dielectric layers 22 and 23.

As shown in FIG. 17, in some embodiments, the second patterning process may use a different photomask 62 than the first patterning process to define opening 43. In some embodiments, the top width W431 of opening 43 may be greater than the bottom width W432 of opening 43. In some embodiments, the top width W431 of opening 43 may be smaller than the top width W411 of opening 41, and the bottom width W432 of opening 43 may be smaller than the bottom width W412 of opening 41. The second patterning process may include a dry etching process, where the maximum width of opening 43 typically occurs at the top (i.e., W431) if no specific etching angle adjustments are applied (such as angled etching). In some embodiments, the sidewalls of opening 43 may be vertical. In some other embodiments, opening 43 may have a wider top and narrower bottom configuration. Using a photomask 62 different from the photomask 61 used in the first patterning process ensures that the bottom width W432 of opening 43 is smaller than the bottom width W412 of opening 41. In some embodiments, opening 43 is located within the coverage area of opening 41.

As shown in FIG. 18, in some other embodiments, the second patterning process may use the same photomask 61 as the first patterning process to define opening 43. In some embodiments, opening 43 may have a wider top and narrower bottom configuration, with the top of opening 43 aligned vertically with the top of opening 41. As explained, the configuration of opening 43 can be adjusted and controlled through the etching process. In the embodiment shown in FIG. 18, as long as opening 43 has a wider top and narrower bottom configuration, with angled sidewalls, using the same photomask 61 can still ensure that the bottom width W432 of opening 43 is smaller than the bottom width W412 of opening 41. In the embodiment shown in FIG. 17, although an additional photomask 62 is needed, the etching process has more flexibility, providing a larger process window. In the embodiment shown in FIG. 17, the same photomask 61 can be used in multiple stages to reduce manufacturing costs, though this requires higher precision in the etching process.

Over-etching is common in etching processes. Generally, over-etching is an undesirable outcome in etching, and it is controlled or improved by adjusting parameters or using etching selectivity ratios. However, in some embodiments of this disclosure, over-etching during the formation of opening 43 can increase the contact area between the subsequent conductive plug 37 and the current spreading layer 31, aiding current conduction and reducing resistance. In some embodiments, manufacturing method 700 may further comprise an over-etching process on the exposed part of the current spreading layer 31, positioning the bottom of opening 43 within the current spreading layer 31. In some embodiments, manufacturing method 700 may further comprise an etching process on the dielectric layers 22 and 23, setting the endpoint at the current spreading layer 31, and continuing the etching process for a preset time after detecting the endpoint signal to control the depth of opening 43 within the current spreading layer 31. In some embodiments, the distance between the bottom of opening 43 and surface 11A of the substrate 11 (D42 as shown in FIG. 4) is between 0.01 and 0.5 micrometers. Opening 43 stops within, but does not penetrate, the current spreading layer 31. In some embodiments, the depth of opening 43 from surface 11A toward surface 11B (D42 as shown in FIG. 4) is less than the depth of current spreading layer 31.

Figure 19:
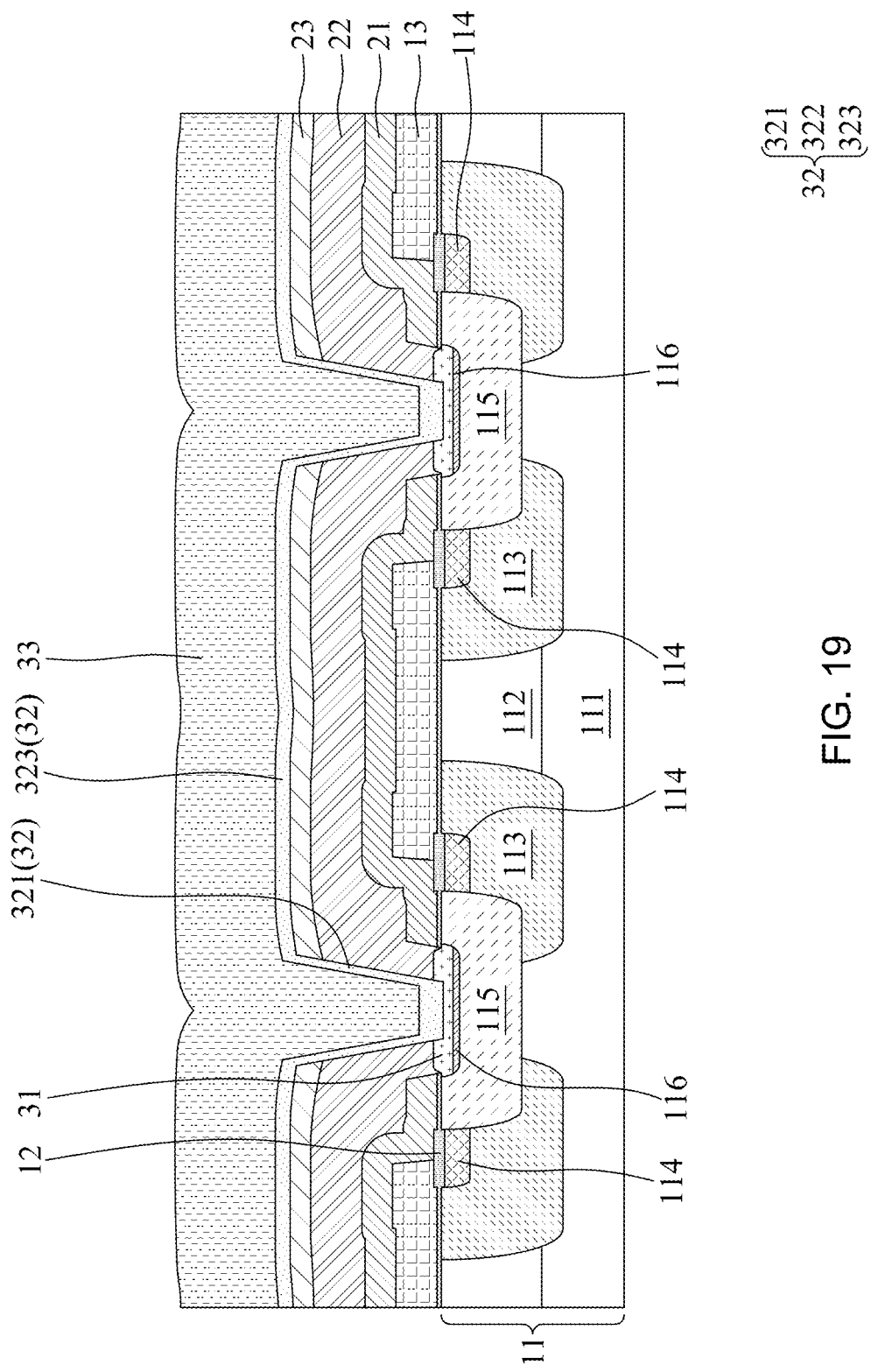

Referring to FIG. 19, manufacturing method 700 may further comprise forming a barrier layer 32 lining opening 43 and forming a metal layer 33 within opening 43. In some embodiments, a first process is performed to form the barrier layer 32, where the first process may include sputtering, electroplating, deposition, or other suitable processes. In some embodiments, a first portion 321 of the barrier layer 32, formed by the first process, lines the inside of opening 43, and a third portion 323 of the barrier layer 32 covers the top surface of the dielectric layer 23. In some embodiments, the metal layer 33 may be formed by deposition. The metal layer 33 may completely cover the surface above surface 11A of substrate 11. In some embodiments, the metal layer 33 may fill opening 43 and further cover the barrier layer 32 above the dielectric layer 23.

Figure 20:
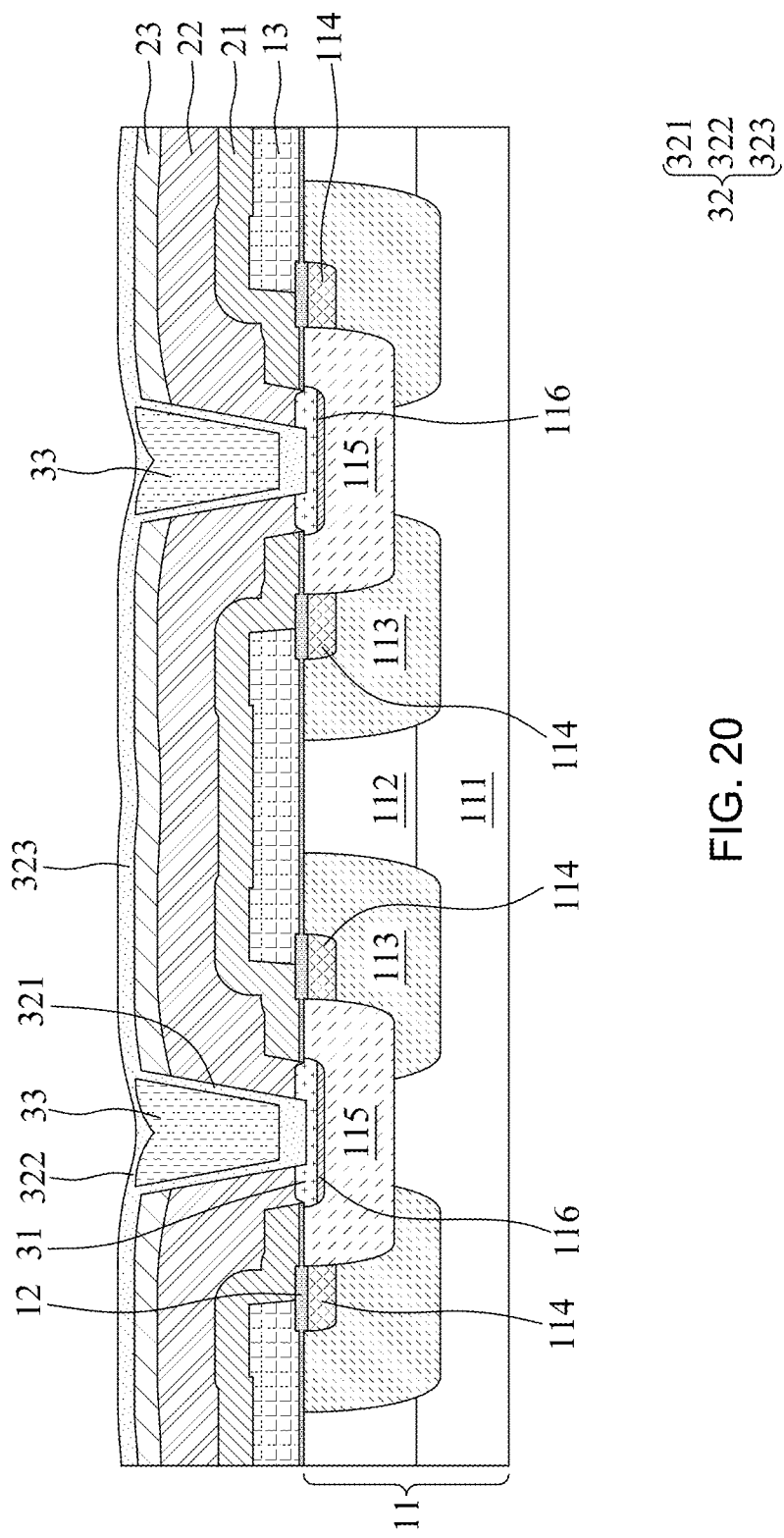
Figure 25:
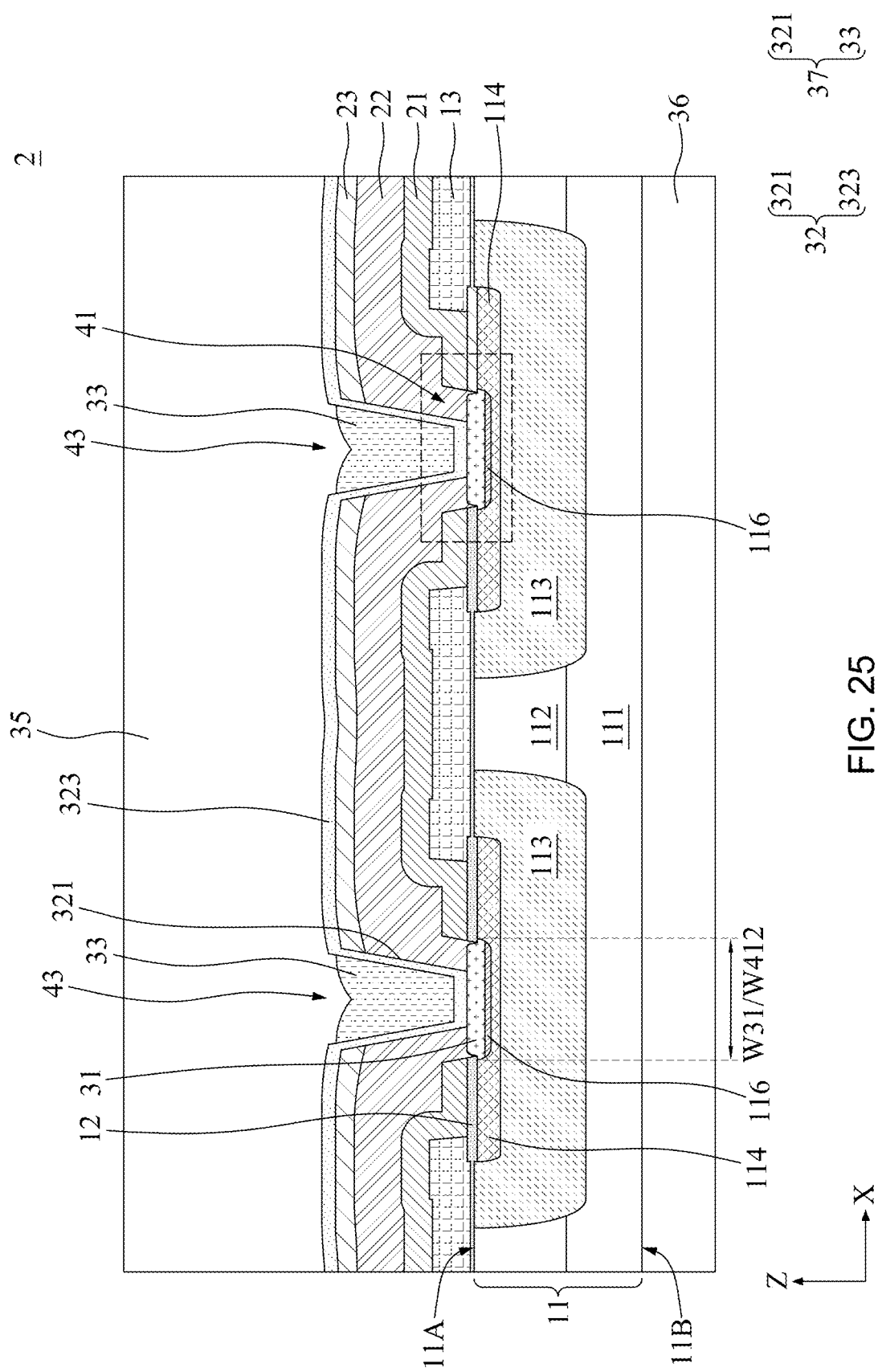
FIG. 25 and FIG. 26 are cross-sectional views of the vertical power semiconductor structure according to different embodiments of the present disclosure.

Referring to FIG. 20, manufacturing method 700 may further comprise removing the portions of the metal layer 33 located above the third portion 323 of the barrier layer 32 and optionally forming the second part 322 of the barrier layer 32 over the metal layer 33. The portions of the metal layer 33 above the third portion 323 of the barrier layer 32 can be removed by an etch-back process or polishing techniques (such as chemical mechanical polishing, CMP). In some embodiments, an etch-back process may be performed on the metal layer 33 to remove the portions of the metal layer 33 above the third portion 323 of the barrier layer 32, with the etching endpoint stopping at the third portion 323 of the barrier layer 32. In these embodiments, no additional deposition process is required to form the second portion 322 of the barrier layer 32 (as shown in FIG. 25). In some other embodiments, an etch-back process may be applied to both the metal layer 33 and the barrier layer 32, removing the portions of the metal layer 33 that lie above the dielectric layer 23 and the third portion 323 of the barrier layer 32, with the etching endpoint stopping at the exposed top surface of the dielectric layer 23. In these embodiments, a deposition process may be performed to form the second portion 322 of the barrier layer 32. Since the deposition process also coats the top surface of the dielectric layer 23, it simultaneously forms a new third portion 323 of the barrier layer 32 along with the second portion 322 (as shown in FIG. 20). In some embodiments, the thickness of the third portion 323 of the barrier layer 32 may be approximately equal to the thickness of the second portion 322. The first portion 321, second portion 322 of the barrier layer 32, and the metal layer 33 together define the conductive plug 37.

Figure 21:
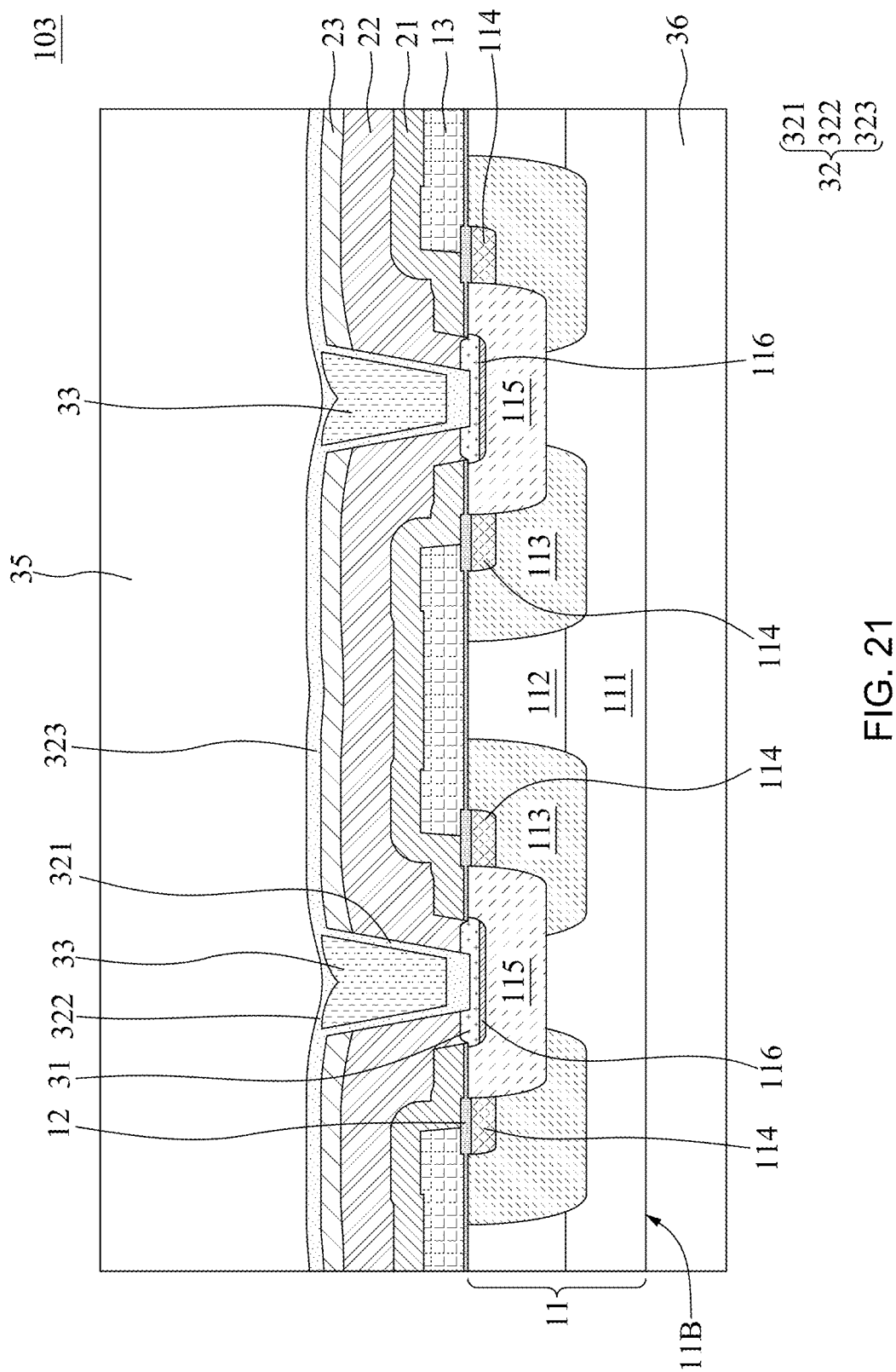

Referring to FIG. 21, after forming the conductive plug 37, manufacturing method 700 further comprises forming the source contact layer 35 on the conductive plug 37 and forming the drain contact layer 36 on the opposite side of the substrate 11 relative to the source contact layer 35. In some embodiments, the source contact layer 35 may contact the third portion 323 of the barrier layer 32. In some embodiments, the source contact layer 35 may contact the second portion 322 and the third portion 323 of the barrier layer 32. In some embodiments, the drain contact layer 36 contacts surface 11B of substrate 11. The source contact layer 35 and/or drain contact layer 36 can be formed through processes such as electroplating, sputtering, deposition, or other suitable methods.

Figure 26:
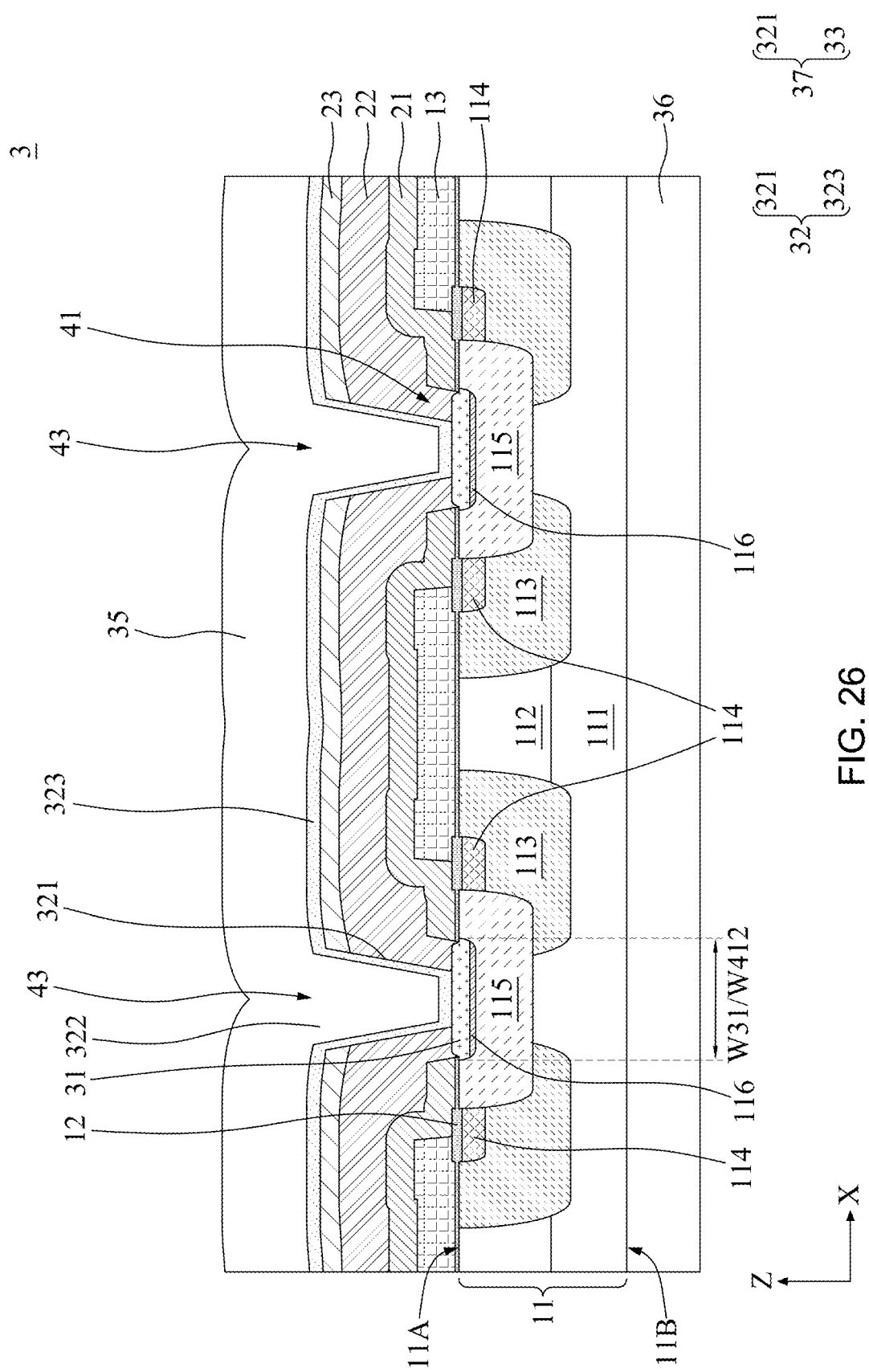

It should be noted that, as described above, when opening 43 is larger, there are more options for the metal material to fill opening 43, allowing the source contact layer 35 and the metal layer 33 to be made of the same metal material. In some embodiments, the step in FIG. 21 can directly apply after forming the barrier layer 32 in FIG. 19, creating the vertical power semiconductor structure 3 as shown in FIG. 26.

Figure 23:
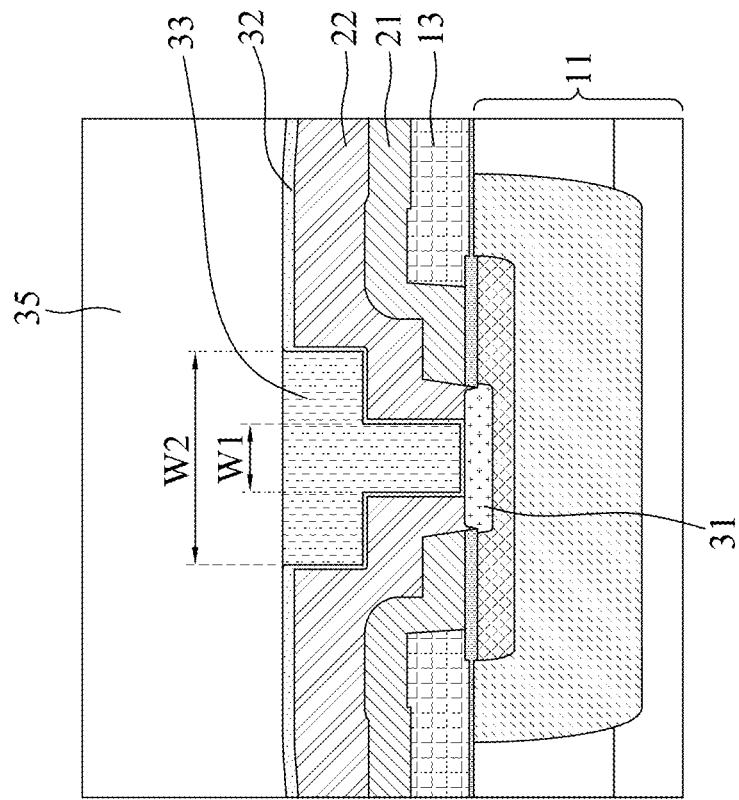
FIG. 22 to FIG. 24 are partial cross-sectional views according to different embodiments of the present disclosure.
Figure 22:
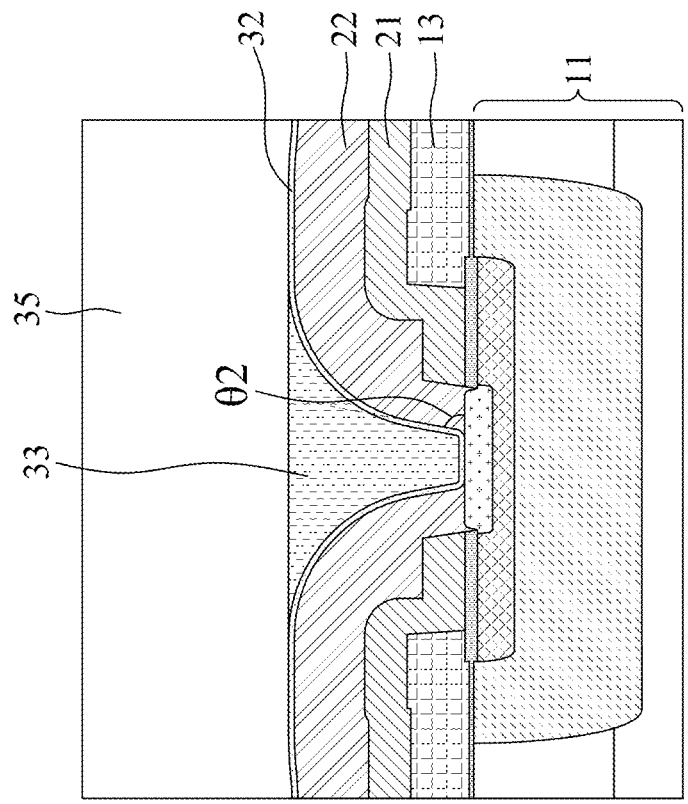
Figure 24:
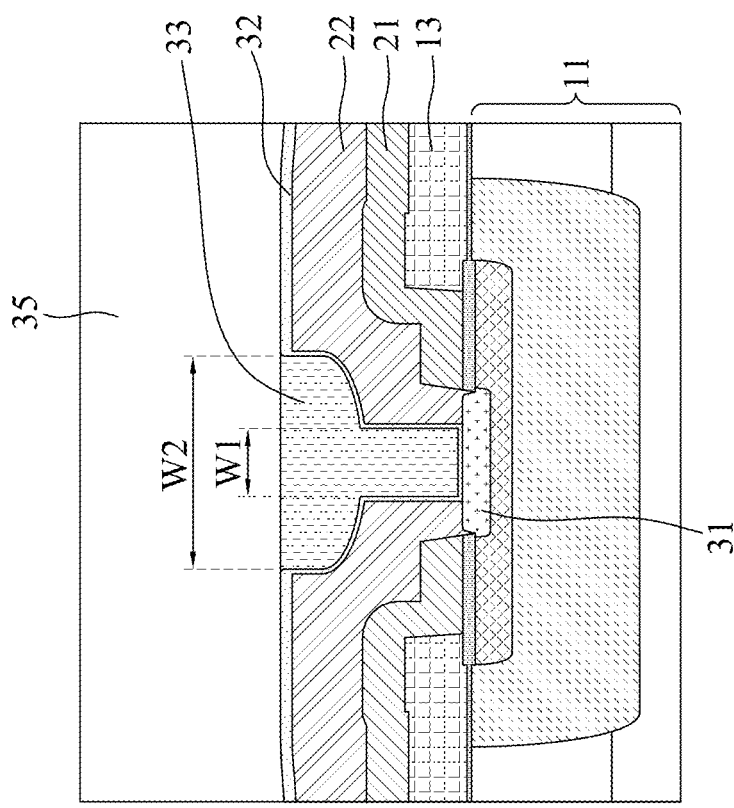

FIGS. 22 to 24 illustrate different configurations of conductive plug 37 according to various embodiments of this disclosure. Based on the embodiments without the dielectric layer 23 or the second portion 322 of the barrier layer 32, these figures show different configurations of the conductive plug 37 formed by different etching processes, providing exemplary illustrations that the current spreading layer 31 of this disclosure can be applied to various configurations of the conductive plug 37. These configurations, though not limited to these examples, can be applied to other embodiments as well.

The sidewall of the conductive plug 37 can be curved, as shown in FIG. 22. The metal layer 33 has a wider opening at the top and a narrower width at the bottom. The cross-sectional shape of 33 narrows as it extends downward, creating a tapered profile. The sidewall of the conductive plug 37 contacts the dielectric layer 22; in other words, the shape of the sidewall of the conductive plug 37 is consistent with the shape of the sidewall of the dielectric layer 22. In some embodiments, the angle θ2 between the bottom of the sidewall of the conductive plug 37 and the current spreading layer 31 may range from 45 to 90 degrees.

The conductive plug 37 may also have a dual damascene structure, as shown in FIGS. 23 and 24. The conductive plug 37 includes a lower portion that contacts the current spreading layer 31 and an upper portion above the lower portion, with the lower portion having a smaller width W1 and the upper portion a larger width W2. Depending on the manufacturing method, the corner between the upper and lower portions can be a nearly 90-degree sharp corner profile (as shown in FIG. 23) or a rounded corner profile (as shown in FIG. 24).

In summary, the current spreading layer 31 in this disclosure provides an additional current conduction path without changing the specifications of the conductive plug 37, which is beneficial for product miniaturization. Furthermore, this disclosure explores the application of the current spreading layer 31 to silicon carbide substrates. According to the manufacturing methods taught above, the current spreading layer 31 can integrate well with a silicon carbide substrate, achieving low resistance.

The following provides further embodiments.

According to one aspect of the present disclosure, a semiconductor device is provided that includes: a substrate comprising a first surface and a second surface positioned on an opposite side of the substrate, a first gate structure located above the first surface of the substrate, a second gate structure located above the first surface of the substrate, adjacent to the first gate structure, a first dielectric layer covering the first gate structure, the second gate structure, and the first surface of the substrate, wherein the first dielectric layer has a first opening between the first gate structure and the second gate structure, a current spreading layer located at a bottom of the first opening, wherein the current spreading layer has a first width approximately equal to a width of the bottom of the first opening, a conductive plug located between the first gate structure and the second gate structure and in contact with the current spreading layer, wherein the bottom of the conductive plug has a second width smaller than the first width, a source contact layer located above the first surface of the substrate, electrically connected to the conductive plug, and a drain contact layer on the second surface of the substrate.

Optionally, in any of the preceding aspects, the first width of the current spreading layer is between 0.1 and 2 micrometers.

Optionally, in any of the preceding aspects, a portion of the current spreading layer extends from a sidewall of the conductive plug to a sidewall of the first dielectric layer, with the portion of the current spreading layer having a third width, and a ratio of the third width to the second width of the bottom of the conductive plug is between 0.1 and 10.

Optionally, in any of the preceding aspects, the third width is between 0.1 and 1 micrometer.

Optionally, in any of the preceding aspects, a thickness of the first dielectric layer is between 50 Å and 5000 Å.

Optionally, in any of the preceding aspects, the semiconductor device further comprises a second dielectric layer covering the first dielectric layer and surrounding the conductive plug, wherein a portion of the second dielectric layer fills the first opening, separating the conductive plug from the first dielectric layer.

Optionally, in any of the preceding aspects, the substrate further comprises a source doping region adjacent to the first surface and extending between the first gate structure and the second gate structure, with opposite sides of the source doping region overlapping under the first gate structure and the second gate structure, respectively, and a first heavily doped region overlapped below and adjacent to the current spreading layer, having the same conductivity type as the source doping region, wherein a doping concentration of the first heavily doped region is greater than a doping concentration of the source-doped region.

Optionally, in any of the preceding aspects, a depth of the first heavily doped region is less than a depth of the source doping region.

Optionally, in any of the preceding aspects, the substrate further comprises a second heavily doped region, adjacent to the first surface and extending between the first gate structure and the second gate structure, having a conductivity type different from the source doping region, wherein the second heavily doped region is not covered by the first gate structure and the second gate structure, and a depth of the second heavily doped region is greater than a depth of the source doping region.

Optionally, in any of the preceding aspects, at least a portion of the first heavily doped region is located inside the source doping region and separated from the source doping region by at least a portion of the second heavily doped region, and at least a portion of the first heavily doped region is located inside the second heavily doped region.

Optionally, in any of the preceding aspects, the semiconductor device further comprises a third dielectric layer located on the first surface of the substrate and beneath the first gate structure and the second gate structure, extending between the first dielectric layer and the first surface of the substrate, wherein a sidewall of the third dielectric layer aligned with a sidewall of the first opening, and the current spreading layer contacting the sidewall of the third dielectric layer.

According to another aspect of the present disclosure, a manufacturing method for a semiconductor device is provided that includes: forming a first gate structure and a second gate structure adjacent to each other above a substrate; forming a first dielectric layer covering the first gate structure, the second gate structure, and the substrate; performing a first patterning process on the first dielectric layer to form a first opening between the first gate structure and the second gate structure, exposing a portion of the substrate; forming a metal layer on a bottom of the first opening, covering the exposed portion of the substrate; performing a first annealing process on the metal layer to form a metal silicide layer; performing a second annealing process on the metal silicide layer to form a current spreading layer, wherein a temperature of the first annealing process is lower than a temperature of the second annealing process, and a resistance of the current spreading layer is less than a resistance of the metal silicide layer; and forming a conductive plug on the current spreading layer, wherein a width of a bottom of the conductive plug is less than a width of the current spreading layer.

Optionally, in any of the preceding aspects, the manufacturing method may further include performing an ion implantation process on the exposed portion of the substrate before forming the metal layer to form a heavily doped region, wherein the heavily doped region has the same conductivity type as a source doping region in the substrate, and a doping concentration of the heavily doped region is greater than a doping concentration of the source doping region.

Optionally, in any of the preceding aspects, the manufacturing method may further include performing an ion bombardment process on the exposed portion of the substrate before forming the metal layer to increase the surface roughness of the exposed portion of the substrate, wherein the ion bombardment process uses inert gas ions.

Optionally, in any of the preceding aspects, the manufacturing method may further include performing an ion implantation process on the metal layer before the first annealing process, implanting at least one element from groups III or V, or inert gas ions, into the metal layer.

Optionally, in any of the preceding aspects, the manufacturing method may further include removing any unreacted portions of the metal layer after the first annealing process.

Optionally, in any of the preceding aspects, the manufacturing method may further include forming a second dielectric layer covering the current spreading layer and the first dielectric layer and performing a second patterning process on the second dielectric layer to form a second opening between the first gate structure and the second gate structure, exposing a portion of the current spreading layer, wherein a width of a bottom of the second opening is smaller than the width of the current spreading layer.

Optionally, in any of the preceding aspects, the second patterning process includes etching the second dielectric layer to remove a portion of the second dielectric layer and performing an over-etching process on the exposed portion of the current spreading layer, wherein the bottom of the second opening is located within the current spreading layer.

Optionally, in any of the preceding aspects, a distance between the bottom of the second opening and a top surface of the substrate is between 0.01 and 0.5 micrometers.

Optionally, in any of the preceding aspects, the first patterning process and the second patterning process use the same photomask.

Optionally, in any of the preceding aspects, the conductive plug is made of tungsten, and the method further includes forming a source contact layer above the conductive plug and forming a drain contact layer on a side of the substrate opposite to the source contact layer.

Features described in the context of one embodiment may be used in combination with other embodiments. For example, each of the optional features described above in the context of the apparatus may be used in combination with the method.

According to the structures and processes disclosed above, steps in the aforementioned processes can be adjusted or reordered while maintaining the same objectives and concepts, in order to achieve the same or similar semiconductor structures.

In this disclosure, spatial relative terms such as "below," "beneath," "lower," "above," "upper," "left," "right," "on", etc., are used to describe the relationships between one component or feature and one or more other components or features as depicted in the figures. Aside from the orientations depicted in the figures, these spatial relative terms are also intended to cover different operational orientations of the device. The device can be oriented in other ways (e.g., rotated 90 degrees or placed in other orientations), and the spatial relative descriptions used herein are intended to be interpreted correspondingly. It should be understood that when a component is said to be "connected to" or "coupled to" another component, it can be directly connected or coupled to the other component, or intervening components may be present.

As used herein, terms like "approximately," "substantially," and "about" are used to describe and account for small variations. When used in conjunction with an event or circumstance, these terms can refer to the precise occurrence of the event or circumstance as well as instances that are close to such occurrence. As used herein concerning given values or ranges, the term "about" generally means within ±10%, ±5%, ±1%, or ±0.5% of a given value or range. Ranges can be expressed as from one endpoint to another endpoint, or encompassing everything between two endpoints. All ranges disclosed herein include their endpoints unless otherwise specified. The term "substantially coplanar" may refer to two surfaces that are positioned along the same plane with a positional difference of a few micrometers (μm), such as within 10 μm, 5 μm, 1 μm, or 0.5 μm. When numerical values or characteristics are described as "substantially" the same, the terms may denote values within ±10%, ±5%, ±1%, or ±0.5% of the stated average value.

The foregoing content outlines several embodiments' features and the detailed aspects of this disclosure. The embodiments described herein can readily serve as the basis for designing or modifying other processes and structures to achieve similar purposes or to attain the advantages introduced by the embodiments discussed.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, which may perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device, comprising:
    a substrate comprising a first surface and a second surface opposite the first surface;
    a first gate structure and a second gate structure located over the first surface of the substrate;
    a first dielectric layer covering the first gate structure, the second gate structure, and portions of the first surface of the substrate;

a current spreading layer located between the first gate structure and the second gate structure, wherein at least a portion of the current spreading layer is located in the substrate;

a conductive plug located on the current spreading layer, wherein the current spreading layer has a first width larger than a second width of a bottom of the conductive plug; and a second dielectric layer covering the first dielectric layer and surrounding the conductive plug, wherein a portion of the second dielectric layer separates the conductive plug from the first dielectric layer.

2. The semiconductor device of claim 1, further comprising:

a source contact layer located above the first surface of the substrate and electrically connected to the conductive plug; and a drain contact layer located on the second surface of the substrate.

3. The semiconductor device of claim 1, wherein a portion of the current spreading layer extends from a sidewall of the conductive plug to a sidewall of the first dielectric layer, with the portion of the current spreading layer having a third width, and a ratio of the third width to the second width of the bottom of the conductive plug is between 0.1 and 10.

4. The semiconductor device of claim 3, wherein the first width of the current spreading layer is between 0.1 and 2 micrometers, and the third width is between 0.1 and 1 micrometer.

5. The semiconductor device of claim 1, wherein a thickness of the first dielectric layer is between 50 Å and 5000 Å.

6. The semiconductor device of claim 1, further comprising:

a source doped region located in the substrate adjacent to the first surface and extending between the first gate structure and the second gate structure, with portions of the source doping region overlapping partially under the first gate structure and the second gate structure, respectively; and a first heavily doped region overlapped below and adjacent to the current spreading layer, having the same conductivity type as the source doping region, wherein a doping concentration of the first heavily doped region is greater than a doping concentration of the source doped region, and a depth of the first heavily doped region is less than a depth of the source doping region.

7. The semiconductor device of claim 1, further comprising:

a second heavily doped region in the substrate, adjacent to the first surface and extending between the first gate structure and the second gate structure, having a conductivity type different from the source doped region, wherein the second heavily doped region is not covered by the first gate structure and the second gate structure, and a depth of the second heavily doped region is greater than a depth of the source doping region.

8. The semiconductor device of claim 7, wherein at least a portion of the first heavily doped region is located in the source doped region and at least a portion of the first heavily doped region is located in the second heavily doped region.

9. The semiconductor device of claim 7, further comprising:

a third dielectric layer located on the first surface of the substrate and below the first gate structure and the second gate structure, extending between the first dielectric layer and the first surface of the substrate, wherein a sidewall of the third dielectric layer is aligned with a sidewall of the first dielectric layer, and the current spreading layer is in contact with the sidewall of the third dielectric layer.

10. A semiconductor device, comprising:

a substrate;

a first gate structure and a second gate structure disposed on the substrate;

a first dielectric layer covering the first gate structure, the second gate structure, and a portion of the substrate;

a current spreading layer disposed between the first gate structure and the second gate structure, and surrounded by the first dielectric layer;

a conductive plug between the first gate structure and the second gate structure, and including a first portion disposed on the current spreading layer and having a first width, and a second portion disposed on the first portion and having a second width greater than the first width; and a second dielectric layer covering the first dielectric layer and portions of the current spreading layer, wherein the second dielectric layer surrounds the conductive plug, and a portion of the second dielectric layer is disposed between the conductive plug and the first dielectric layer.

11. The semiconductor device of claim 10, wherein a portion of the current spreading layer extends into the substrate.

12. The semiconductor device of claim 10, wherein the current spreading layer has a third width greater than the first width of the conductive plug and less than the second width of the conductive plug.

13. The semiconductor device of claim 10, wherein the current spreading layer has a third width, and a ratio of the third width to the second width of the bottom of the conductive plug is between 0.1 and 10.

14. The semiconductor device of claim 10, wherein the second portion is at a level substantially higher than a top surface of the first dielectric layer.

15. The semiconductor device of claim 10, further comprising:

a source doped region disposed in the substrate and proximal to a top surface of the substrate, wherein the source doped region is at least partially overlapped with the first gate structure and the second gate structure; and a first heavily doped region overlapped below and adjacent to the current spreading layer, surrounded by the source doped region and having a conductivity type same as a conductivity type of the source doping region, wherein a doping concentration of the first heavily doped region is greater than a doping concentration of the source doped region.

16. The semiconductor device of claim 15, wherein a depth of the first heavily doped region is substantially less than a depth of the source doping region.

17. The semiconductor device of claim 15, further comprising:

a second heavily doped region disposed in the substrate, adjacent to the top surface of the substrate and between the first gate structure and the second gate structure, wherein the current spreading layer covers at least a portion of the second heavily doped region.

18. The semiconductor device of claim 17, wherein the second heavily doped region has a conductivity type different from the conductivity type of the first heavily doped region.

* * * * *